(12) United States Patent
Toguchi et al.

(10) Patent No.: US 6,921,588 B2
(45) Date of Patent: Jul. 26, 2005

(54) ORGANIC ELECTROLUMINESCENT DEVICE HAVING HIGH LUMINANCE EFFICIENCY

(75) Inventors: Satoru Toguchi, Tokyo (JP); Hitoshi Ishikawa, Tokyo (JP); Hiroshi Tada, Tokyo (JP); Yukiko Morioka, Tokyo (JP); Atsushi Oda, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/737,319

(22) Filed: Dec. 14, 2000

(65) Prior Publication Data

US 2002/0034654 A1 Mar. 21, 2002

(30) Foreign Application Priority Data

Dec. 15, 1999 (JP) .............................................. 11-356683
Dec. 15, 1999 (JP) .............................................. 11-356684

(51) Int. Cl.[7] ................................................ H05B 33/12
(52) U.S. Cl. ...................... 428/690; 428/917; 313/504; 313/506
(58) Field of Search ................................ 428/690, 704, 428/917; 313/504, 506

(56) References Cited

U.S. PATENT DOCUMENTS

| | | | | |
|---|---|---|---|---|
| 5,989,737 A | * | 11/1999 | Xie et al. .................... | 428/690 |
| 6,013,383 A | * | 1/2000 | Shi et al. .................... | 428/690 |
| 6,329,083 B1 | * | 12/2001 | Toguchi et al. ............. | 428/690 |
| 6,329,084 B1 | * | 12/2001 | Tamano et al. ............. | 428/690 |
| 2003/0134145 A1 | * | 7/2003 | Toguchi et al. ............. | 428/690 |

FOREIGN PATENT DOCUMENTS

| | | | |
|---|---|---|---|
| JP | 08-199162 | | 8/1996 |
| JP | 10-88120 A | * | 4/1998 |
| JP | 11-144869 | | 5/1999 |
| JP | 11-185961 A | * | 7/1999 |
| JP | 11-279426 | | 10/1999 |
| JP | 2001-011031 | | 1/2001 |

OTHER PUBLICATIONS

Partial machine-assisted translation of JP 11-144869 (May 1999).*
Partial machine-assisted translation of JP 11-185961 (Jul. 1999).*

* cited by examiner

*Primary Examiner*—Marie Yamnitzky
(74) *Attorney, Agent, or Firm*—McGuireWoods LLP

(57) ABSTRACT

An organic EL device comprising an anode, a cathode, and one or more organic thin-film layers having a light-emitting layer sandwiched between the anode and the cathode, the organic thin-film layers including, either singly or as a mixture, a perylene compound represented by a general formula [1] or a benzoperylene compound represented by a general formula [2].

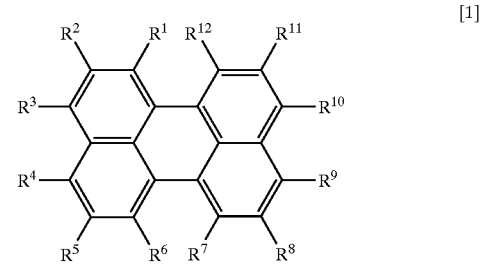

[1]

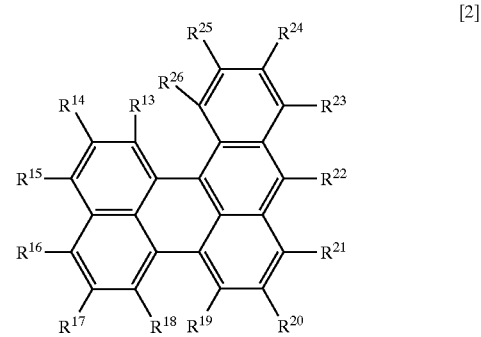

[2]

1 Claim, 1 Drawing Sheet

ORGANIC ELECTROLUMINESCENT DEVICE HAVING HIGH LUMINANCE EFFICIENCY

BACKGROUND OF THE INVENTION (a) Field of the Invention

The present invention relates to an organic electroluminescent device having an excellent luminescence property such as high luminance efficiency.

(b) Description of the Related Art

An organic electroluminescent device (which will hereinafter be called "organic EL device") is a light-emitting device which makes use of the principle that when an electric field is applied, a fluorescent material emits light in response to the charge recombination of holes injected from an anode and electrons injected from a cathode After C. W. Tang et al. of Eastman Kodak Company reported a low-voltage-driven organic EL device using a double layered structure (C. W. Tang, S. A. Vanslyke, Applied Physics Letters, Vol. 51, 913 (1987) and the like), studies on an organic EL device have been briskly carried out. Tang et al reported an organic EL device using tris(8-hydroxyquinolinol aluminum) in a light-emitting layer and a triphenyldiamine derivative in a hole-transporting layer. This stacked structure gives such advantages as an improvement in the injection efficiency of holes into the light-emitting layer; blocking of electrons injected from a cathode, which increase the efficiency of exciton production from charge recombination; and confine the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices.

As a hole transporting material, triphenylamine derivatives and aromatic diamine derivatives such as 4,4',4"-tris(3-methylphenylphenylamino)-triphenylamine and N,N'-diphenyl-N,N'-bis(3-methylphenyl)-[1,1'-biphenyl]-4,4'-diamine which are star burst type compounds are well known (for example, JP-A-8(1996)-20771, JP-A-8(1996)-40995, JP-A-8(1996)-40997, JP-A-8(1996)-53897, and JP-A-8(1996)-87122).

As an electron transporting material, oxadiazole derivatives, triazole derivatives and the like are well known.

Chelate complexes such as tris(8-quinolinolate)aluminum complex, coumarin derivatives, tetraphenylbutadiene derivatives, bisstyrylarylene derivatives, oxadiazole derivatives and the like are known as light emitting materials. Since various color light in a visible region from blue to red are obtained from these light-emitting materials, there is increased expectation for industrialization of a full color organic EL device (refer to, e.g., JP-A-8(1996)-23965, JP-A-7(1995)-138561, and JP-A-3(1991)-200889).

Although the various organic EL devices with high brightness and long lifetime have been reported, these properties are not enough. The present inventors described the organic EL devices with the high brightness using the specified perylene compound or the specified benzoperylene compound in JP-A-11(1999)-144869 and JP-A-11(1999)-185961.

However, sufficient performances are not obtained for some of the perylene compounds and the benzoperylene compounds because of the aggregation of compound molecules Other compounds used in organic EL devices also form molecular aggregation which causes concentration quenching in the case of a mixture with high concentration and the solid containing the compounds singly, and the concentration quenching reduced brightness of the devices in many cases.

SUMMARY OF THE INVENTION

It is therefore an object of the present invention to provide an organic EL devices having high luminance by suppressing the concentration quenching.

The inventors found that an organic EL device which includes a specific perylene derivative or a benzoperylene derivative having substituents with large steric hindrance suppressing the aggregation of the molecules has higher luminance. The inventors also found that the above compounds have good carrier transporting property, and an organic EL device including a hole transporting layer composed of above compounds, an organic EL device including an electron transporting layer composed of above compounds and an organic EL device including a thin film composed of above compound and other hole transporting or electron transporting materials provide light-emission with a higher brightness than that of conventional organic EL devices, thereby leading to completion of the present invention.

Thus, the present invention provides an organic electroluminescent (EL) device including an anode, a cathode, and one or more organic thin-film layers including a light-emitting layer sandwiched between the anode and the cathode, the organic thin-film layers including, either singly or as a mixture, a perylene derivative represented by a general formula [1] or a benzoperylene derivative represented by a general formula [2] as follows:

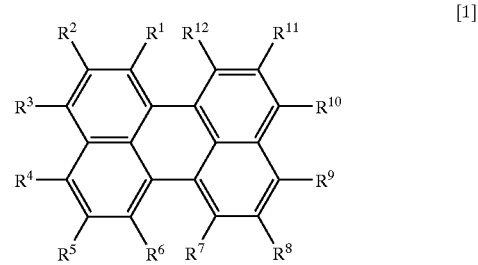

[1]

[2]

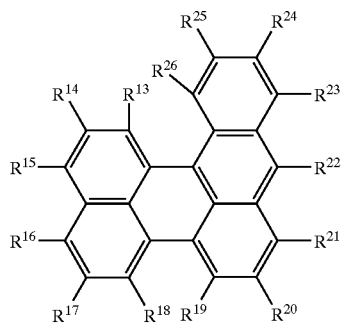

wherein each of $R^1$ to $R^{12}$ and $R^{13}$ to $R^{26}$ each independently represents hydrogen atom, halogen atom, hydroxyl group, substituted or non-substituted amino group, nitro group, cyano group, substituted or non-substituted alkyl group, substituted or non-substituted alkenyl group, substituted or non-substituted styryl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group or substituted or non-substituted aryloxy group; any two of $R^1$ to $R^{12}$ or $R^{13}$ to $R^{26}$ may form a ring; and at least one of $R^1$ to $R^{12}$ and at least one of $R^{13}$ to $R^{26}$ are diarylamino groups represented by —$NAr^1Ar^2$ (each of $Ar^1$ and $Ar^2$ represents substituted or non-substituted aromatic hydrocarbon group or substituted or non-substituted aromatic heterocyclic group), and at least one of $R^1$ to $R^{12}$ and at least one of $R^{13}$ to $R^{26}$ other than the diarylamino group is a substituent with steric hindrance for suppressing aggregation of molecules.

It is preferable that at least one of $Ar^1$ and $Ar^2$ has a styryl group as a substituent.

It is preferable that the substituent with steric hindrance included in the general formula [1] is the substituted or non-substituted alkyl group, the substituted or non-substituted cycloalkyl group, the substituted or non-substituted alkoxy group, the substituted or non-substituted aromatic hydrocarbon group, the substituted or non-substituted aromatic heterocyclic group, the substituted or non-substituted aralkyl group or the substituted or non-substituted aryloxy group.

In accordance with the present invention, the organic EL device including the compound represented by the general formula [1] or [2] as the component material of the organic thin film has higher luminance than that of a conventional organic EL device.

The above and other objects, features and advantages of the present invention will be more apparent from the following description.

PREFERRED EMBODIMENTS OF THE INVENTION

Figure 1:
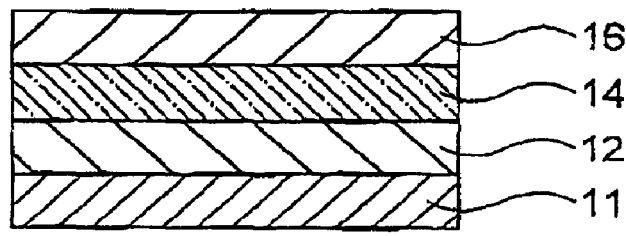
FIG. 1 is a cross sectional view showing an organic EL device in accordance with a first embodiment of the present invention.

Now, the present invention is more specifically described.

A compound used in the present invention is that having a structure represented by the general formula [1] or [2].

Each of $R^1$ to $R^{12}$ and $R^{13}$ to $R^{26}$ in the general formulae [1] and [2] independently represents hydrogen atom, halogen atom, hydroxyl group, substituted or non-substituted amino group, nitro group, cyano group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, wherein any two of $R^1$ to $R^{12}$ or any two of $R^{13}$ to $R^{26}$ may form a ring; and at least one of $R^1$ to $R^{12}$ and at least one of $R^{13}$ to $R^{26}$ are diarylamino groups represented by —$NAr^1Ar^2$ (each of $Ar^1$ and $Ar^2$ represents substituted or non-substituted aromatic hydrocarbon group or substituted or non-substituted aromatic heterocyclic group).

In the above formulae [1] and [2], at least one of $Ar^1$ and $Ar^2$ may include substituted or non-substituted styryl group as a substituent.

At least one of $R^1$ to $R^{12}$ and at least one of $R^{13}$ to $R^{26}$ other than the diarylamino group are substituents with large steric hindrance for suppressing aggregation of molecules.

The halogen atom includes fluorine atom, chlorine atom, bromine atom and iodine atom.

The substituted or non-substituted amino group is expressed by —$NX_1X_2$, wherein each of given $X_1$ and $X_2$ independently represents hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3- dinirtroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl 3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-y4 group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-hurazanyl group, 2 thienyl group, 3-thienyl group, 2-methylpyrrole-1-y4 group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl1-indolyl group, 4-t-butyl1-indolyl group, 2-t-butyl3-indolyl group, and 4-t-butyl3-indolyl group.

Examples of the substituted or non-substituted alkyl group include methyl group, ethyl group, propyl group, isopropyl group, n-butyl, s-butyl, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-hydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-chloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyano methyl group, 1-cyanoethyl group, 2-cyanoethyl group, 2-cyanoisobutyl group, 1,2-dicyanoehtyl group, 1,3-dicyanoisopropy group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or non-substituted alkenyl group include vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1- dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the substituted or non-substituted cycloalkyl group include cyclopropyl group, cyclobutyl group, cyclopentyl group, cyclohexyl group, 4-methylcyclohexyl group, 1-adamantyl group and 2-adamantyl group.

Examples of the substituted or non-substituted alkoxy group include groups represented by —OY wherein Y may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-chloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodo isopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, cyclopropyl group, cyclobutyl group, cyclopentyl group, cyclohexyl group, 4-methylcyclohexyl group, 1-adamantyl group and 2-adamantyl group.

Examples of the substituted or non-substituted aromatic hydrocarbon group include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthril group, 4'-methylbiphenylyl group and 4'-t-butyl-p-terphenyl-4-yl group.

Examples of the substituted or non-substituted aromatic heterocyclic group include 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, L-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl, group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-plenanthroline-7-yl group, 1,8-phenanthroline-9-yl group, 1,8-phenanthroline-710-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-3yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1l-indolyl group, 2-mehyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted or non-substituted aralkyl group include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylmethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or non-substituted aryloxy group is represented by —OZ, wherein Z may be phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1.8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl groups 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-mehyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The substituted or non-substituted alkoxycarbonyl group is represented by —COOY, wherein Y may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3c-dihydroxyisopropyl group, 2,3-dihydroxy-t-butyl group, 1,2,3-trihydroxypropyl group, chloro methyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or non-substituted styryl group include, in addition to styryl group and 2,2-diphenylvinyl group, substituted styryl group and substituted 2,2-diphenylvinyl group having, as a substituent, halogen atom, hydroxyl group, substituted or non-substituted diarylamino group expressed by —NAr$^3$Ar$^4$ (each of Ar$^3$ and Ar$^4$ represents substituted or non-substituted aryl group having 6 to 20 carbon atoms), nitro group, cyano group, the abovedescribed substituted or nonsubstituted alkyl group, the above-described substituted or non-substituted alkenyl group, the above-described substituted or non-substituted cycloalkyl group, the above-described substituted or non-substituted alkoxy group, the above-described substituted or non-substituted aromatic hydrocarbon group, the above-described substituted or non-substituted aromatic heterocyclic group, the above-described substituted or non-substituted aralkyl group, the above-described substituted or non-substituted aryloxy group, the above-described substituted or non-substituted alkoxycarbonyl group, or the carboxyl group. Examples of the aryl group having 6 to 20 carbon atoms represented by the Ar$^3$ and Ar$^4$ include phenyl group, naphthyl group, anthryl group, phenanthryl group, naphthacenyl group, and pyrenyl group. Examples of the substituent of the aryl group includes halogen atom, hydroxyl group, nitro group, cyano group, the above-described substituted or non-substituted alkyl group, the above-described substituted or non-substituted alkenyl group, the above-described substituted or non-substituted cycloalkyl group, the above-described substituted or non-substituted alkoxy group, the above-described substituted or non-substituted aromatic hydrocarbon group, the above-described substituted or non-substituted aromatic heterocyclic group, the above-described substituted or non-substituted aralkyl group, the above-described substituted or non-substituted aryloxy group, the above-described substituted or non-substituted alkoxycarbonyl group, and the carboxyl group.

Examples of a divalent group forming the ring using two of the R$^1$ to R$^{12}$ or R$^{13}$ to R$^{26}$ include tertamethylene group, pentamethylene group, hexamethylene group, diphenylmethane-2,2'-diyl group, diphenylmethane-3,3'-diyl group, diphenylpropane-4,4'-diyl group and 1,3-butadiene-1,4-diyl group.

Any group can be used as the substituent with steric hindrance for suppressing the aggregation of the molecules so long as the group is bulky enough to prevent the aggregation of the molecules. Examples thereof include the substituted or non-substituted alkyl group, the substituted or non-substituted cycloalkyl group, the substituted or non-substituted alkoxy group, the substituted or non-substituted aromatic hydrocarbon group, the substituted or non-substituted aromatic heterocyclic group, the substituted or non-substituted aralkyl group and the substituted or non-substituted aryloxy group. Concrete examples thereof include isopropyl group, t-butyl group, 2,3-dibromo-t-butyl group, 2,3-diiodo-t-butyl group, t-butoxy group, 2,3-dibromo-t-butoxy group, 2,3-diiodo-t-butoxy group, 2-methylbutane-2-yl group, 2-methylbutane-2-yloxy group, cyclopropyl group, cyclobutyl group, cyclopentyl group, cyclohexyl group, 4-methylcyclohexyl group, norbornane-1-yl group, norbornane.-2-yl group, norbornane-7-yl group, norbornane-1-yloxy group, norbornane-2-yloxy group, norbornane-7-yloxy group, bornane-2-yl group, bornane-2-yloxy group, tricyclo[5.3.2.04,9]dodecane-1-yl group, tricyclo[5.3.2.04,9]dodecane-2-yl group, tricyclo[5.3.2.04,9]dodecane-3-yl group, tricyclo[5.3.2.04,9]dodecane-10-yl group, tricyclo[5.3.2.04,9]dodecane-11-yl group, tricyclo[5.3.2.04,9]dodecane-1-yloxy group, tricyclo[5.3.2.04,9]dodecane-2-yloxy group, tricyclo[5.3.2.04,9]dodecane-3-yloxy group, tricyclo[5.3.2.04,9]dodecane-10-yloxy group, tricyclo[5.3.2.04,9]dodecane-11-yloxy group, p-cyclofanyl group, 1-adamantyl group, 2-adamantyl group, 1-adamantyloxy group, 2-adamantyloxy group, phenyl group, tolyl group, 9-fluorenyl group, 2,2-dimethyl-1-propyl group, cyclopropylmethyl group, cyclobutylmethyl group, cyclopentylmethyl group, cyclohexylmethyl group, 4-methylcyclohexylmethyl group, norbornane-1-yl-methyl group, norbornane-2-yl-methyl group, norbornane-7-yl-methyl group, tricyclo[5.3.2.04,9]dodecane-1-yl-methyl group, tricyclo[5.3.2.04,9]dodecane-2-yl-methyl group, tricyclo[5.3.2.04,9]dodecane-3-yl-methyl group, tricyclo[5.3.2.04,9]dodecane-10-yl-methyl group, tricyclo[5.3.2.04,9]dodecane-11-yl-methyl group, p-cyclofanemethyl group, 1-adamantylmethyl group, 2-adamantylmethyl group, benzyl group, 4-methylbenzyl group, 1-naphthyloxy group, 1-naphthylmethyl group, 9-anthrylmethyl group, 9-anthryloxy group, triphenylmethyl group, 2,2,2-triphenylethyl group, 9-fluorenyl group, 9-fluorenyloxy group, 9,9'-spirobifluorene-4yl group, 9,9'-spirobifluorene-3-yl group, 9,9'-spirobifluorene-4-yl-methyl group, 9,9'-spirobifluorene-3-yl-methyl group, 9,9'-spirobifluorene-4-yloxy group, 9,9'-spirobifluorene-3-yloxy group, tris(2,2- dimethylpropyl)methyl group, tris(2,2-dimethylpropyl) methyloxy group, 2,2,2-tris (2,2-dimethylpropyl)ethyl group, bicyclo[3,2,1]octane-1-yl group, bicyclo[3,2,1] octane-2-yl group, bicyclo[3,2,1]octane-3-yl group, bicyclo [3,2,1]octane-7-yl group, bicyclo[3,2,1]octane-8-yl group, bicyclo[3,2,1]octane-1-yloxy group, bicyclo[3,2,1]octane-2-yloxy group, bicyclo[3,2,1]octane-3-yloxy group, bicyclo[3,2,1]octane-7-yloxy group, bicyclo[3,2,1]octane-8-yloxy group, bicyclo[3,2,1]octane-1-yl-methyl group, bicyclo[3,2,1]octane-2-yl-methyl group, bicyclo[3,2,1]octane-3-yl-methyl group, bicyclo[3,2,1]octane-7-yl-methyl group and bicyclo[3,2,1]octane-8-yl-methyl group.

Although examples of the compounds represented by the general formulae [1] and [2] will be listed, the compounds usable in the present invention are not restricted thereto.

Examples of the compounds represented by the general formula [1] are as follows.

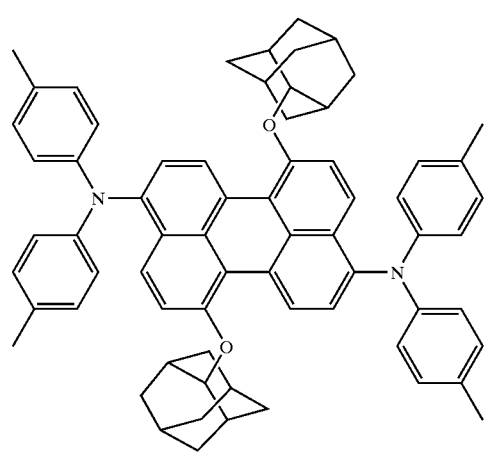

[3]

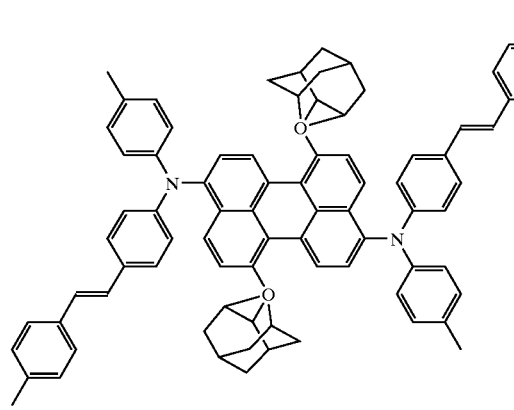

[4]

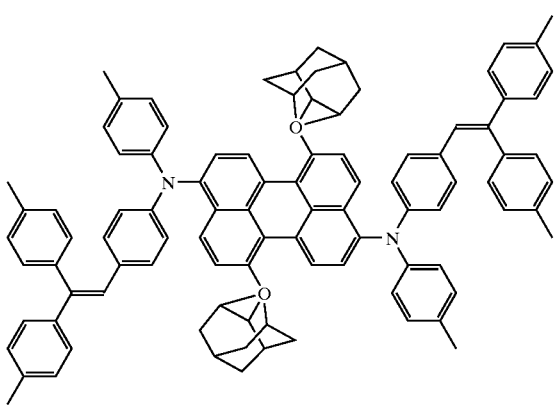

[5]

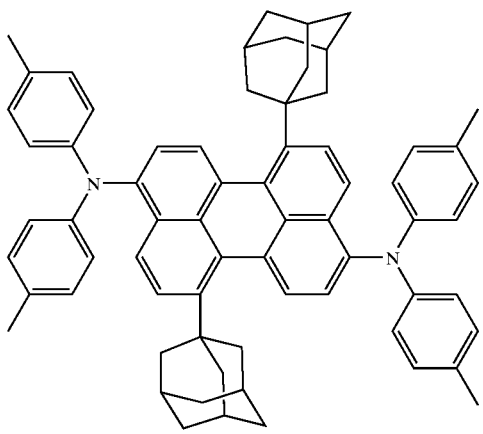

[6]

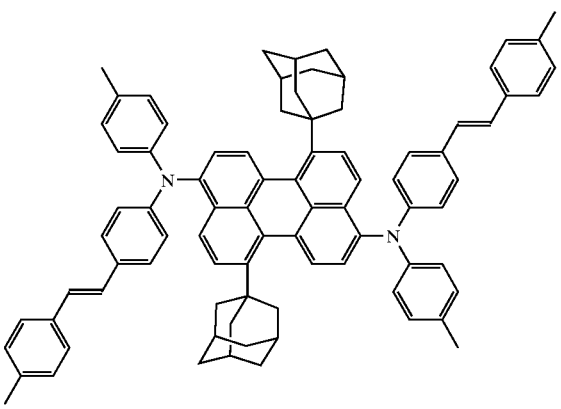

[7]

[8]
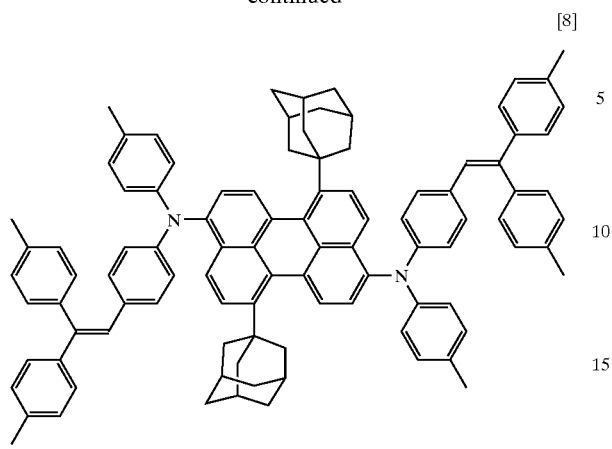
[9]
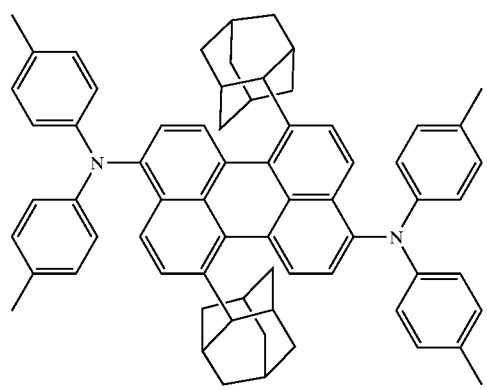
[10]
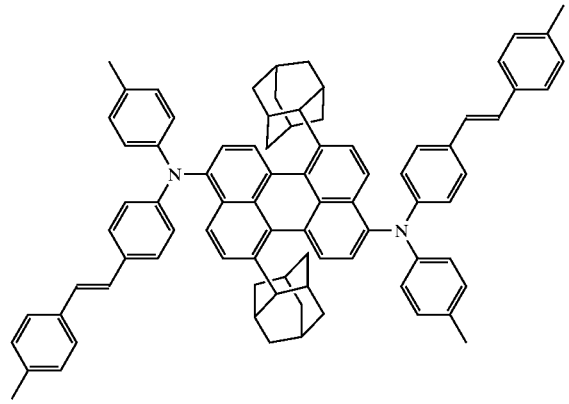
[11]
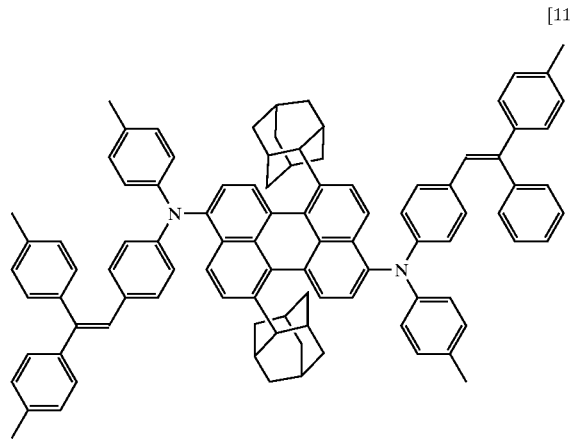
[12]
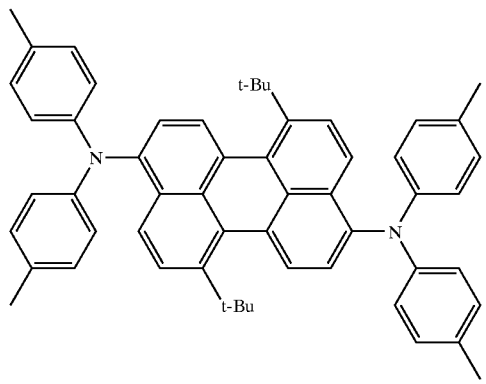
[13]
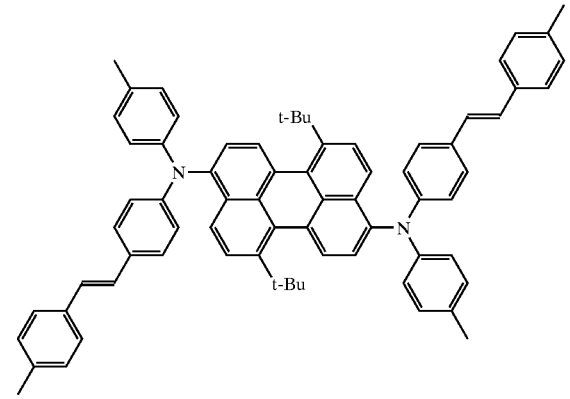
[14]
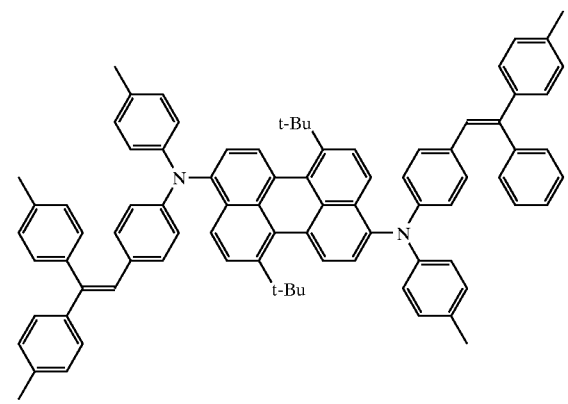
[15]
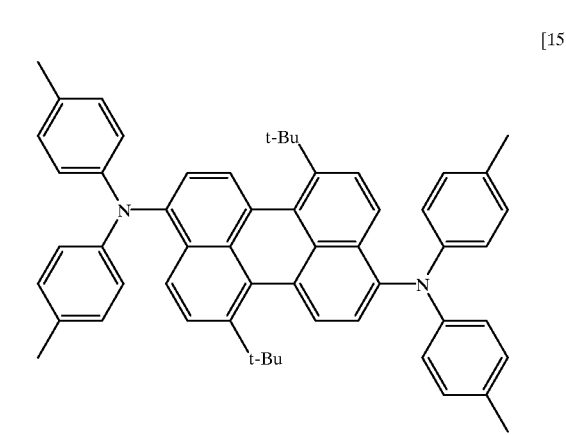

[16]
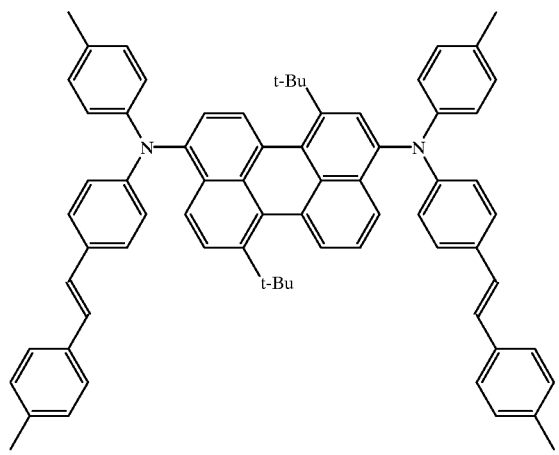
[17]
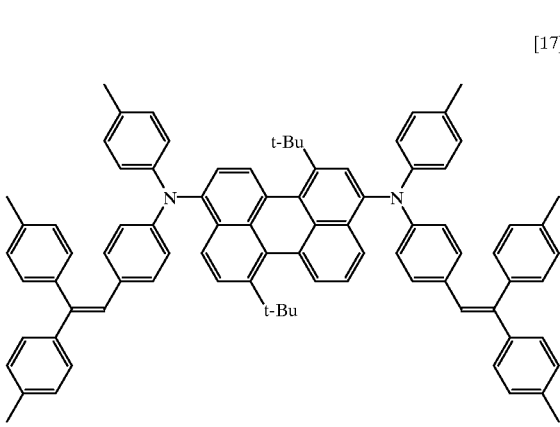
[18]
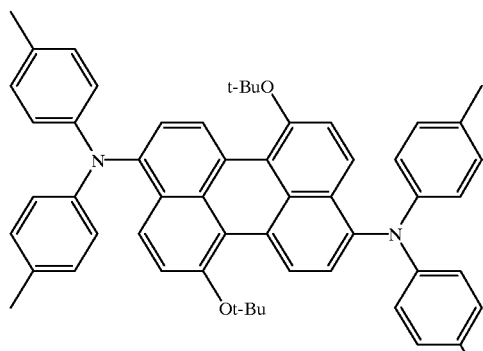
[19]
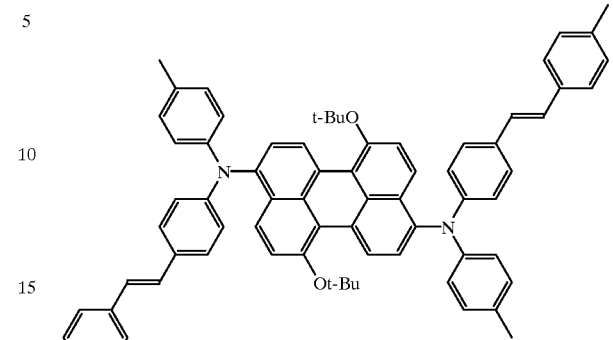
[20]
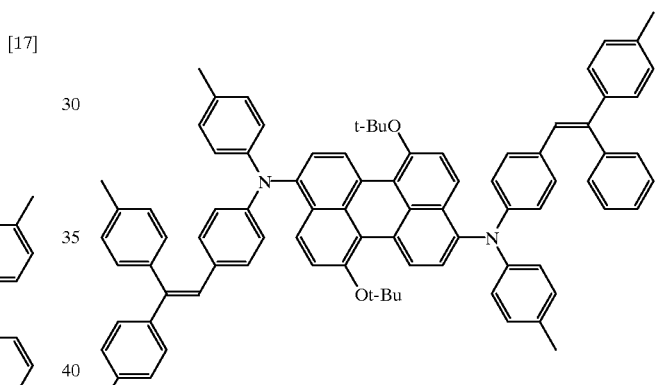
[21]
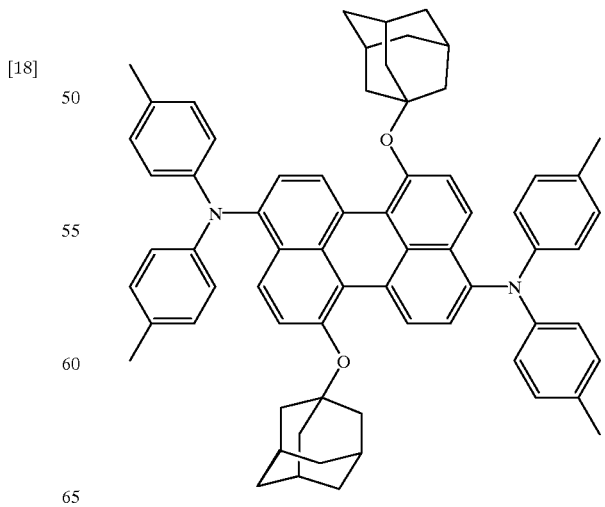

[22]
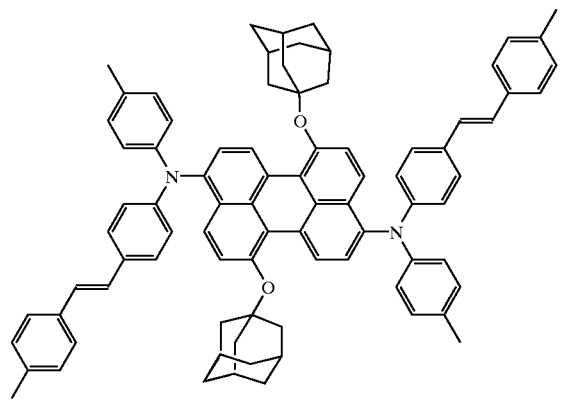
[25]
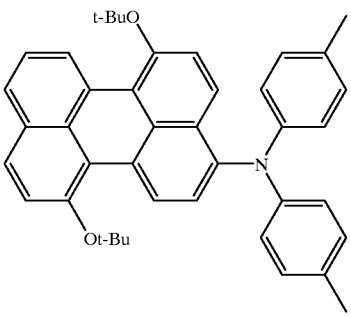
Examples of the compounds represented by the general formula [2] are as follows.
[23]
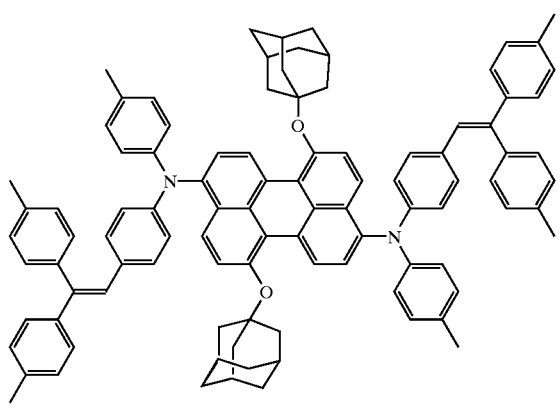
[26]
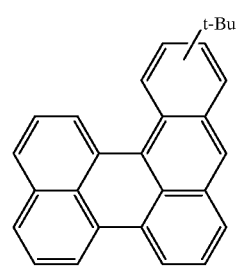
[27]
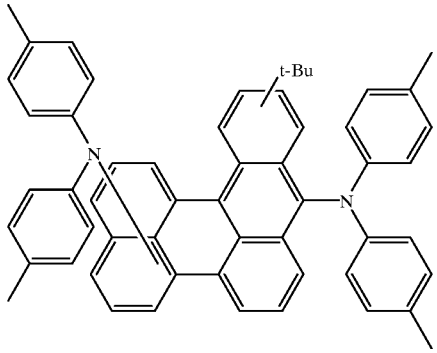
[24]
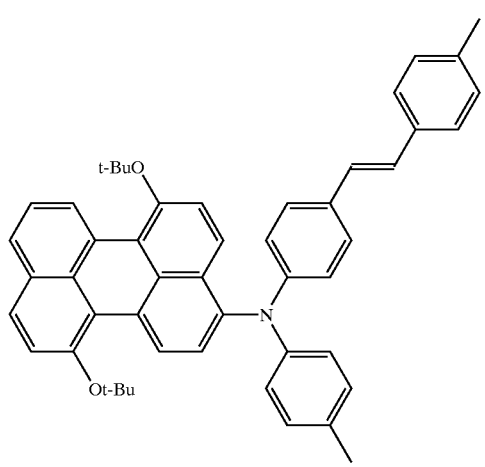
[28]
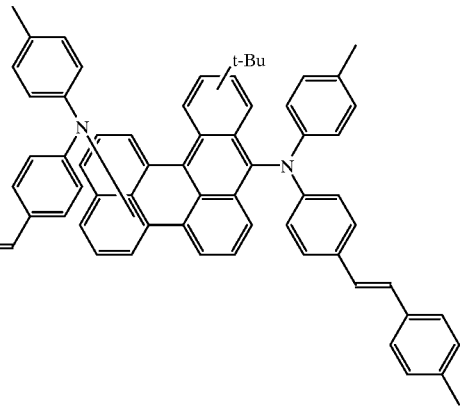

[29]
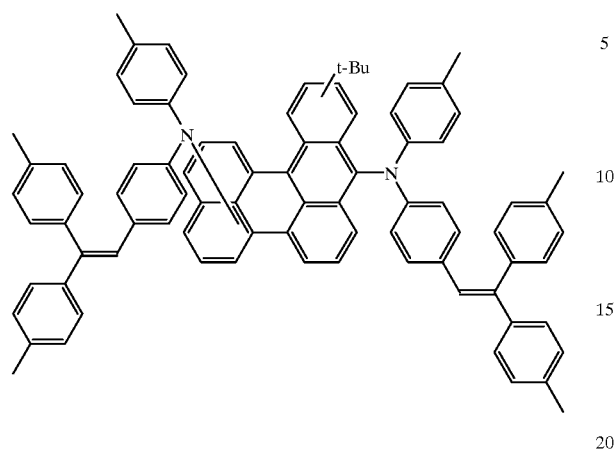
[30]
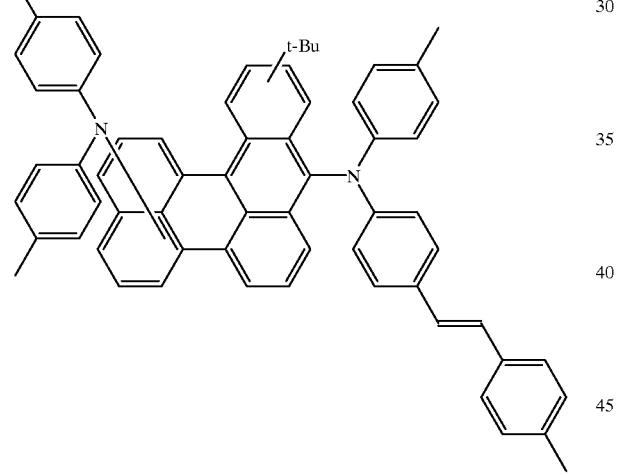
[31]
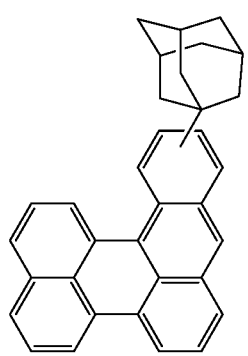
[32]
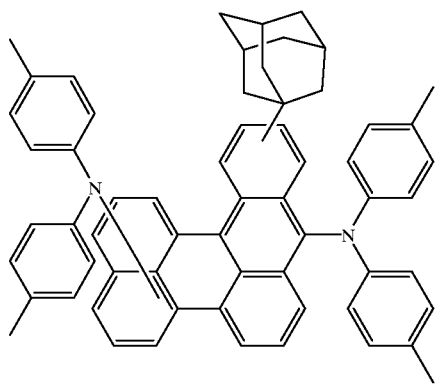
[33]
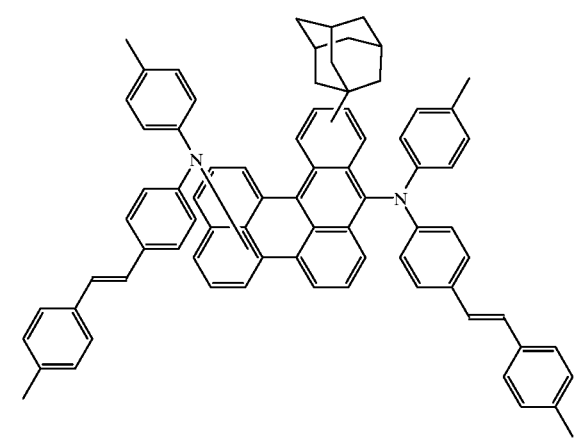
[34]
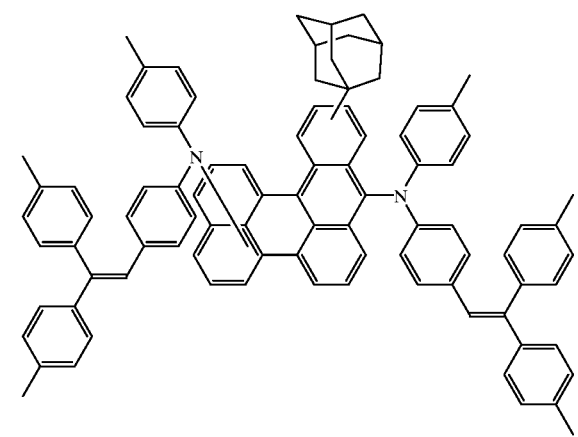

[35]
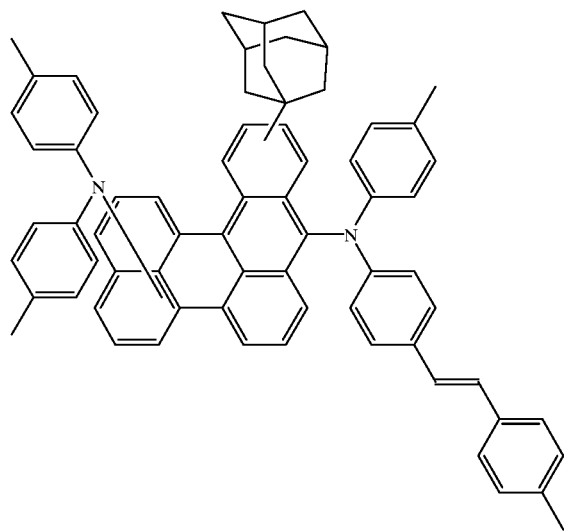
[36]
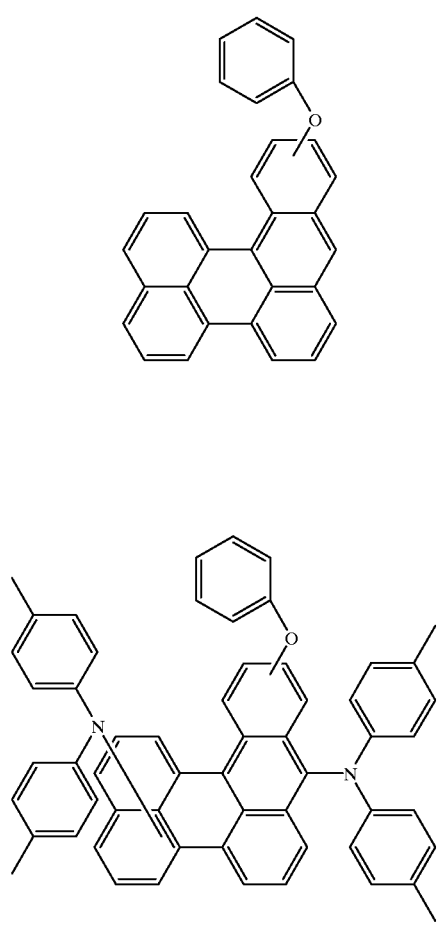
[37]
[38]
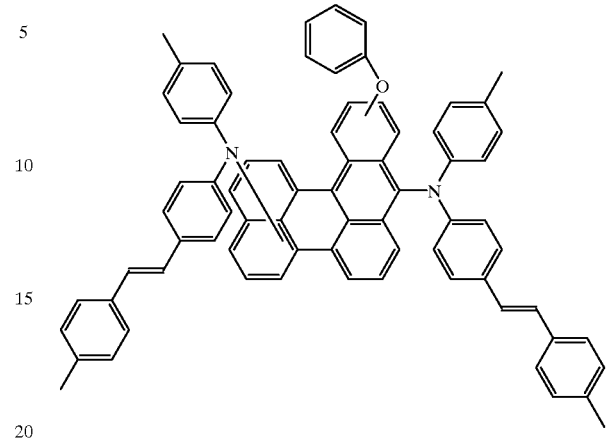
[39]
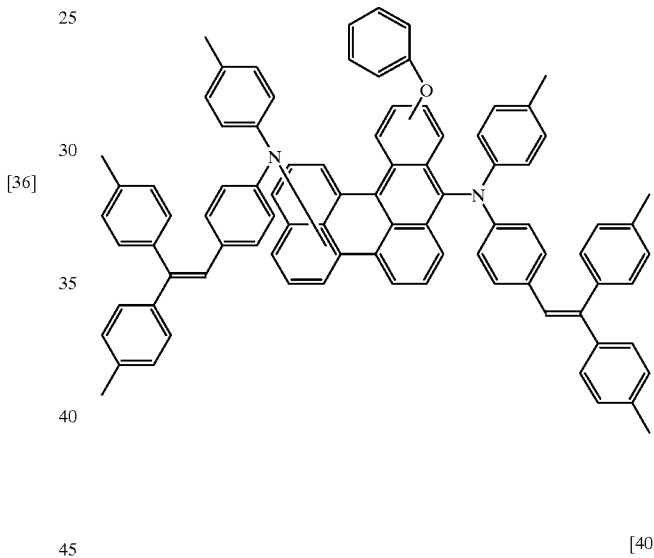
[40]
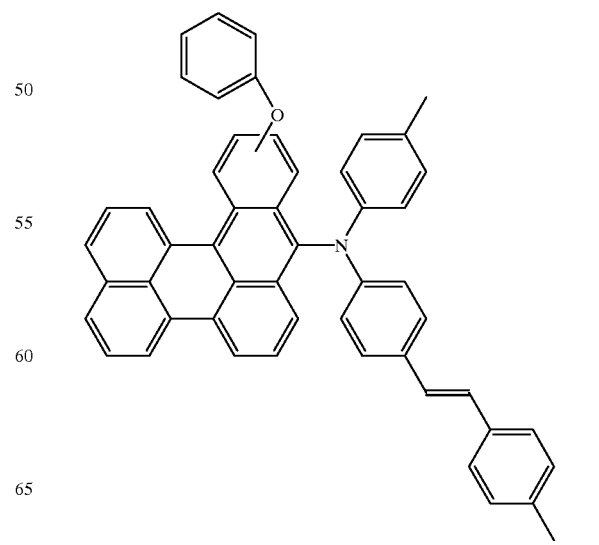

[41]
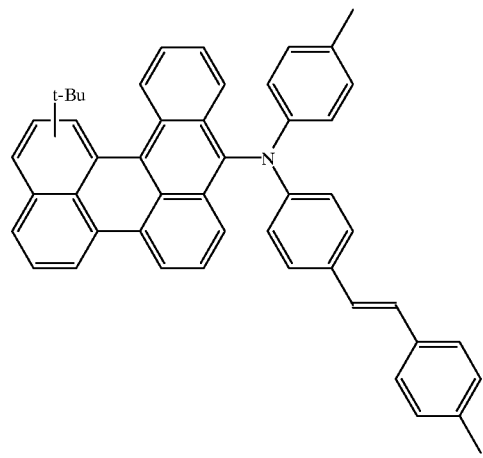
[42]
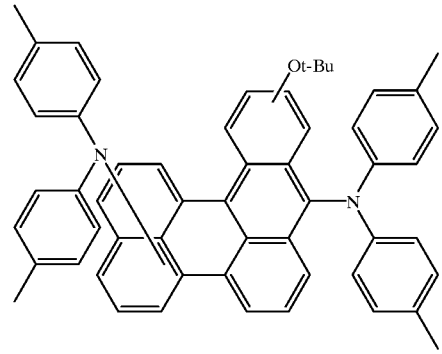
[43]
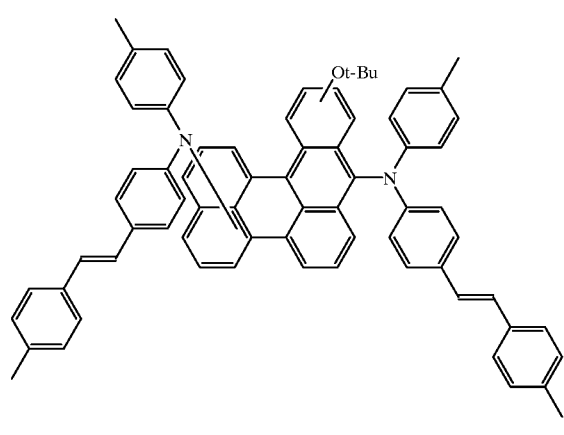
[44]
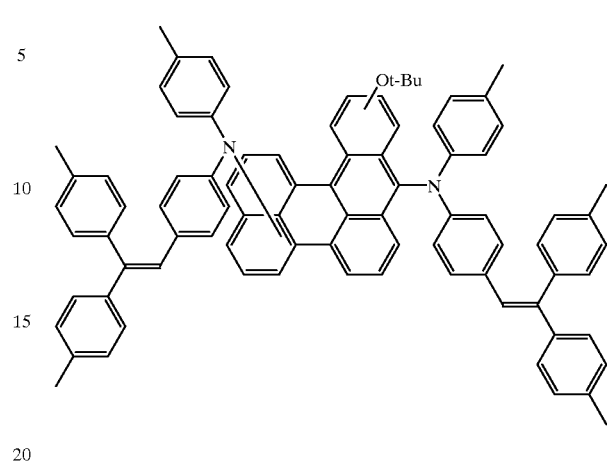
[45]
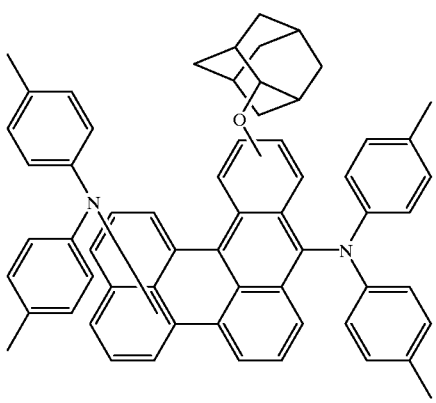
[46]
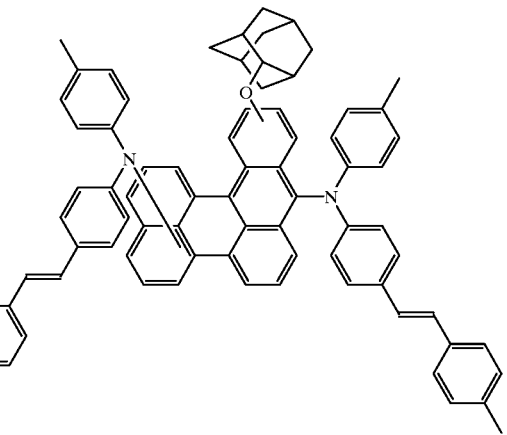

-continued

[47]

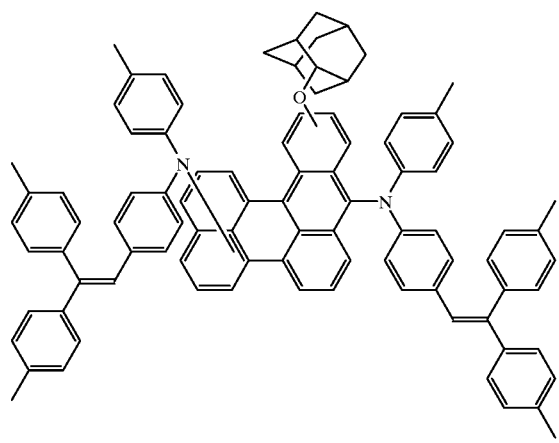

[48]

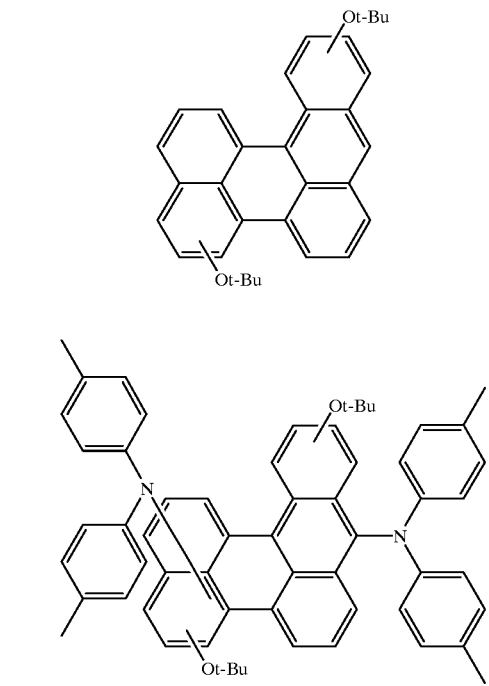

[49]

[50]

-continued

[51]

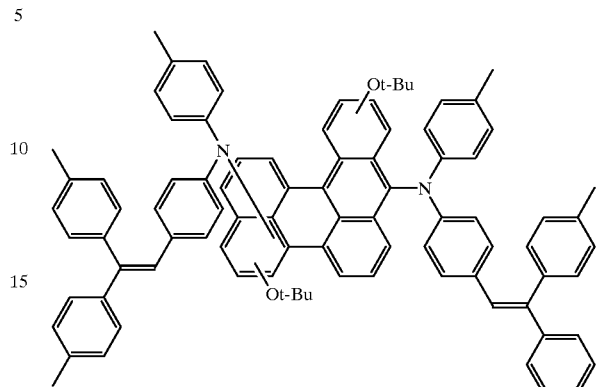

Figure 2:
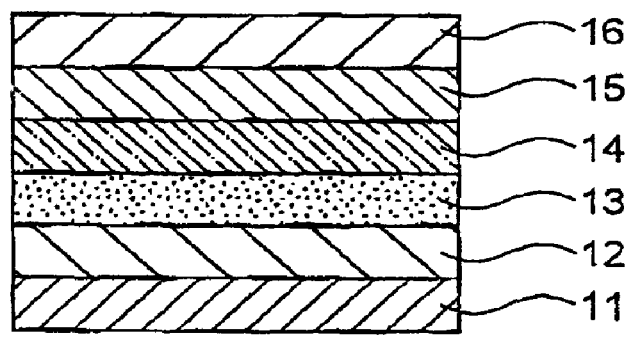
FIG. 2 is a cross sectional view showing an organic EL device of a second embodiment.
Figure 3:
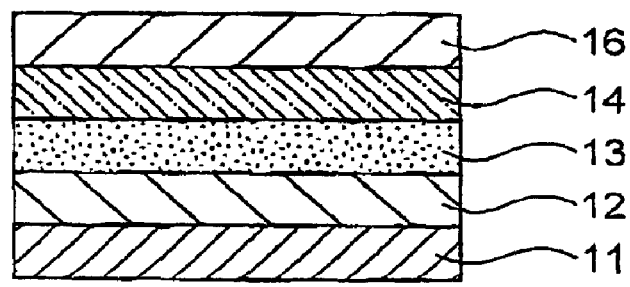
FIG. 3 is a cross sectional view showing an organic EL device of a third embodiment.
Figure 4:
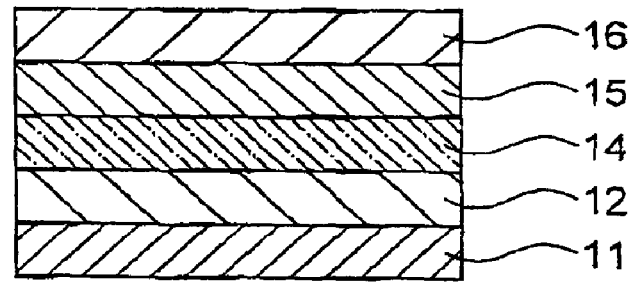
FIG. 4 is a cross sectional view showing an organic EL device of a fourth embodiment.

The structure of the organic EL device of the present invention includes one or more organic thin-film layers between the electrodes, and examples thereof a include that having an anode 12, a light-emitting layer 14 and a cathode 16 stacked in this turn on a glass substrate 11 as shown in FIG. 1, that having the anode 12, a hole transporting layer 13, the light-emitting layer 14, an electron transporting layer 15 and the cathode 16 stacked in this turn on the glass substrate 11 as shown in FIG. 2, that having the anode 12, the hole transporting layer 13, the light-emitting layer 14 and the cathode 16 stacked in this turn on the glass substrate 11 as shown in FIG. 3 and that having the anode 12, the light-emitting layer 14, the electron transporting layer 15 and the cathode 16 stacked in this turn on the glass substrate 11 as shown in FIG. 4.

The compound of the present invention may exist in any one of the organic thin-film layers, and may be doped in the other hole transporting material, light-emitting material and electron transporting material.

There are no particular limitation on the hole transporting material used for the hole transporting layer in the present invention, and any compound that is usually used as an hole transporting material can be used. Examples of such materials include, but not limited to, triphenyldiamine derivatives such as bis[di(p-tolyl)aminophenyl]-1,1-cyclohexane [52], N,N'-diphenyl-N,N'-bis(3-methylphenyl)-1,1'-biphenyl-4,4'-diamine [53] and N,N'-diphenyl-N,N'-bis(1-naphthyl)-1,1'-biphenyl-4,4'-diamine [54], and star burst type molecules [55 to 57].

[52]

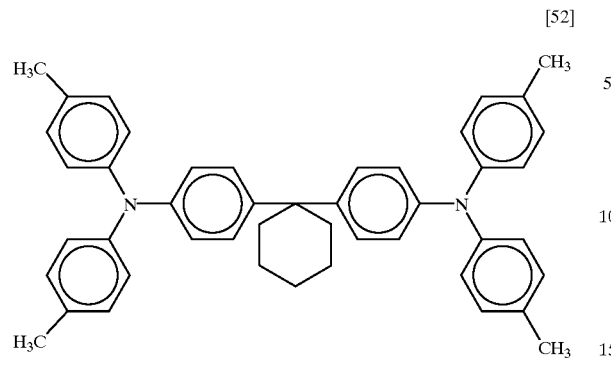

[53]

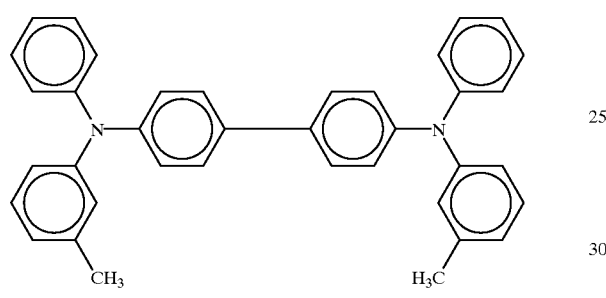

[54]

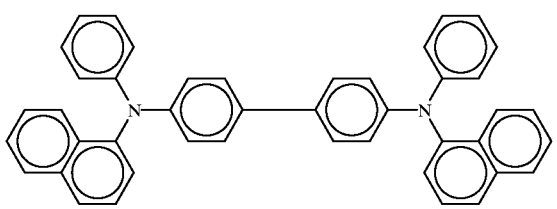

[55]

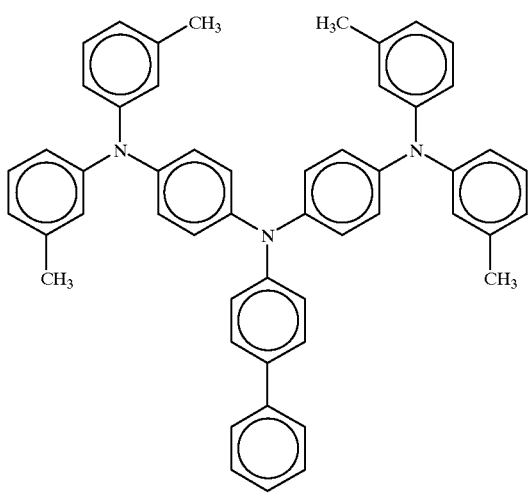

-continued

[56]

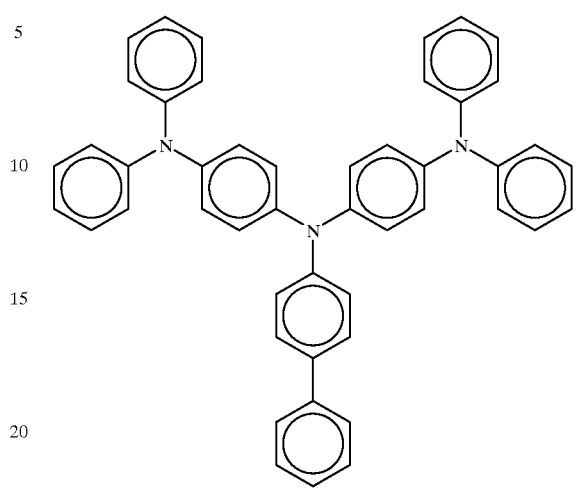

[57]

There are no particular limitation on the electron transporting material used for the electron transporting layer in the present invention, and any compound that is usually used as an electron transporting material can be used. Examples of such materials include, but not limited to, oxadiazole derivatives, such as 2-(4-biphenyl)-5-(4-t-butylphenyl)-1,3,4-oxadiazole [58] and bis{2-(4-t-butylphenyl)-1,3,4-oxadiazole}-m-phenylene [59], triazole derivatives such as compounds [60] and [61], and quinolinol based metallic complex such as compounds [62] to [65].

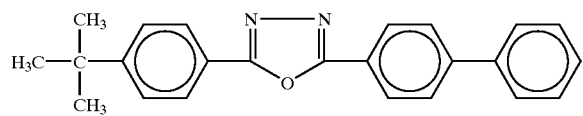
[58]
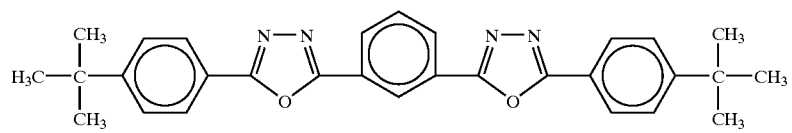
[59]
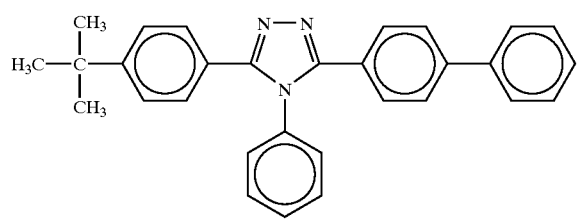
[60]
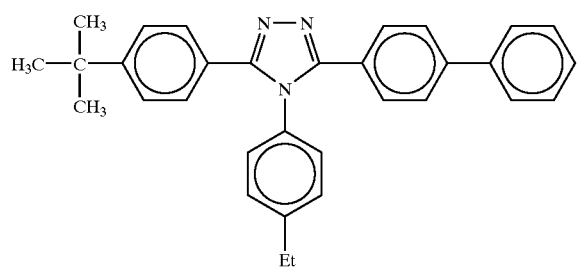
[61]
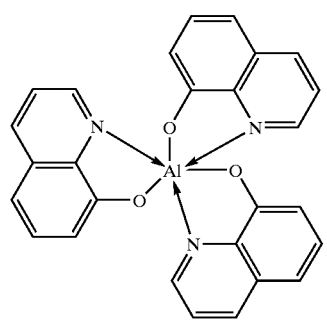
[62]
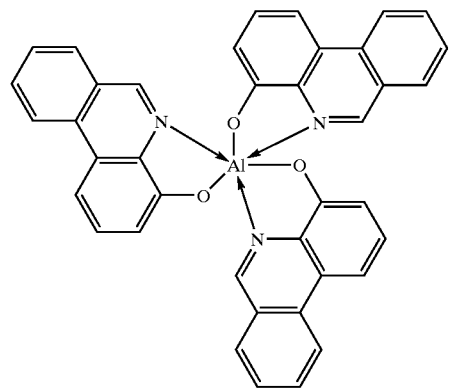
[63]

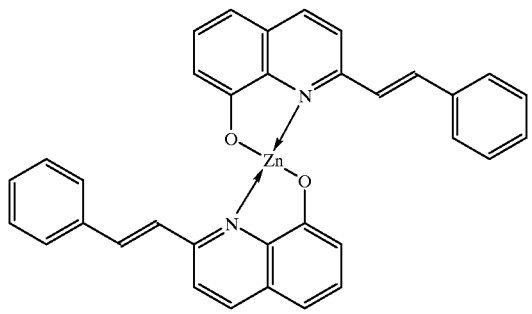

[64]

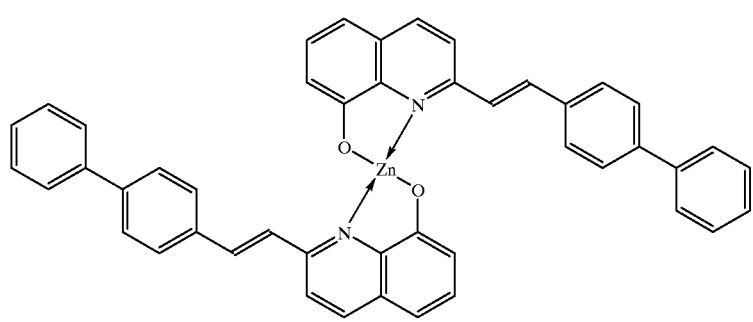

[65]

The anode of the organic EL device plays a role of injecting holes into the holetransporting layer and that having a work function of 4.5 eV or greater is effective Examples of materials for the anode include indium tin oxide (ITO), tin oxide (NESA), gold, silver, platinum and copper.

For the purpose of injecting electrons into the electron-transporting layer or the light emitting layer, the cathode having a smaller work function is preferred Examples for the material for the cathode include, but not limited to, indium, aluminum, magnesium, magnesium-indium alloy, magnesium-aluminum alloy, aluminum-lithium alloy, aluminum-scandium-lithium alloy, and magnesium-silver alloy.

Processes, such as vacuum evaporation or spin-coating, generally used for fabricating a conventional EL device can be used for the organic EL device of the present invention. Examples of such processes for forming the organic thin-film layer including the compounds represented by the general formulae [1] and [2] include, but not limited to, vacuum evaporation, molecular beam epitaxy (MBE), and dipping, spin-coating, casting, bar-coating or roll-coating of solutions wherein these compounds dissolved into solvents.

The organic layers in the organic EL device of the present invention may have any thickness. However, a preferable thickness generally resides between several nanometers and 1 micrometer. When the film is too thin, defects such as pin holes tend to occur. When the film is too thick, on the other hand, a high-applied voltage is required, which tends to deteriorate the efficiency.

SYNTHESIS EXAMPLE 1

Synthesis of the Compound [3] {1,7-di(2-adamantyloxy)-3,9-bis(dL-p-tolylamino)perylene After 1,7-di(2-adamantyloxy)-3,9-dibromoperylene, di-p-tolylamine, potassium carbonate, copper powder and nitrobenzene were introduced in a reaction vessel, the solution was stirred at 200° C. for 40 hours. After the reaction, the nitrobenzene was removed under vacuum pressure, and chloroform was added and filtrated for removal of inorganic compounds. The filtrate was concentrated and purified with a conventional method. As a result, the target compound [3] was obtained.

SYNTHESIS EXAMPLE 2

Synthesis of the Compound [4] {1,7-di(2-adamantyloxy)-3,9-bis(N-p-tolyl-N-4-(4-methylphenyvinyl)phenylamino)perylene The target compound [4] was prepared in the same process as Synthesis Example 1 except that N-4-(4-methylphenyvinyl)phenyl-p-toluidine was used in place of the di-p-tolylamine.

SYNTHESIS EXAMPLE 3

Synthesis of the Compound [5] {1,7-di(2-adamantyloxy)-3,9-bis(N-p-tolyl-N-4-(2,2-di-p-tolylvinyl)phenylamino)perylene The target compound [5] was prepared in the same process as of Synthesis Example 1 except that N-4-(2,2-di-p-tolylvinyl)-phenyl-p-toluidine was used in place of the di-p-tolyl amine.

SYNTHESIS EXAMPLE 4

Synthesis of the Compound [6] {1,7-di-1-adamantyl-3,9-bis(di-p-tolylamino)perylene}

The target compound [6] was prepared in the same process as of Synthesis Example 1 except that 1,7-di-1-adamantyl-3,9-dibromoperylene was used in place of the 1,7-di(2-adamantyloxy)-3,9-dibromoperylene.

SYNTHESIS EXAMPLE 5

Synthesis of the Compound [7] {1,7-di-1-adamantyl-3,9-bis[N-p-tolyl-N-4-(methylphenylvinyl)phenylamino]perylene}

The target compound [7] was prepared in the same process as Synthesis Example 2 except that 1,7-di-1-adamantyl-3,9-dibromoperylene was used in place of the 1,7-di(2-adamantyloxy)-3,9-dibromoperylene.

SYNTHESIS EXAMPLE 6

Synthesis of the Compound [8] {1,7-di-1-adamantyl-3,9-bis[N-p-tolyl-N-4-(2,2-di-p-tolylvinyl)phenylamino]perylene}

The target compound [8] was prepared in the same process as Synthesis Example 3 except that 1,7-di-1-adamantyl-3,9-dibromoperylene was used in place of the 1,7-di(2-adamantyloxy)-3,9-dibromoperylene.

SYNTHESIS EXAMPLE 7

Synthesis of the Compound [18]{1,7-di-t-butoxy-3,9-bis(di-p-tolylamino)perylene}

The target compound [18] was prepared in the same process as Synthesis Example 1 except that 1,7-di-t-butoxy-3,9-dibromoperylene was used in place of the 1,7-di(2-adamantyloxy)-3,9-dibromoperylene.

SYNTHESIS EXAMPLE 8

Synthesis of the Compound [19] {1,7-di-t-butoxy-3,9-bis(N-p-tolyl-N-4-(4-methylphenylvinyl)phenylaminoperylene)

The target compound [19] was prepared in the same process as Synthesis Example 2 except that 1,7-di-t-butoxy-3,9-dibromoperylene was used in place of the 1,7-di(2-adamantyloxy)-3,9-dibromoperylene.

SYNTHESIS EXAMPLE 9

Synthesis of the Compound [20] {1,7-di-t-butoxy-3,9-bis(N-p-tolyl-N-4-(2,2-di-p-tolylvinyl)phenylaminoperylene)

The target compound [20] was prepared in the same process as Synthesis Example 3 except that 1,7-di-t-butoxy-3,9-dibromoperylene was used in place of the 1,7-di(2-adamantyloxy)-3,9-dibromoperylene.

SYNTHESIS EXAMPLE 10

Synthesis of the Compound [24] {1,7-di-t-butoxy-3-(N-p-tolyl-N-4-(4-methylphenylvinyl)phenylamino-perylene)

The target compound [24] was prepared in the same process as Synthesis Example 8 except that 1,7-di-t-butoxy-3-bromoperylene was used in place of 1,7-di-t-butoxy-3,9-dibromoperylene.

SYNTHESIS EXAMPLE 11

Synthesis of the Compound [26] {t-butylbenzo[a]perylene}

After t-butyl-7,14-dioxo-7,14-dihydrobenzo[a]-perylene was treated with zinc powder in pyridine with a conventional method, it was treated with 80%-acetic acid. The product was purified with a conventional method. As a result, the target compound [26] was obtained.

SYNTHESIS EXAMPLE 12

Synthesis of the Compound [27], {bis-di-p-tolylamino}-t-butylbenzo[a]perylene}

After the compound [26] was dissolved in dimethylformamide, two equivalences of N-bromosuccinimide was added and stirred at room temperature. After the reaction, reaction mixture was washed with water, and the product was purified with a conventional method to prepare dibromo-t-butylbenzo[a]perylene. The compound was introduced in a reaction vessel together with di-p-tolylamine, potassium carbonate, copper powder and nitrobenzene, and was stirred at the temperature of 200° C. for 40 hours. After the reaction, nitrobenzene was removed under vacuum pressure, and chloroform was added and filtrated for removal of inorganic compounds. The filtrate was concentrated and purified with a conventional method. As a result, the target compound [27] was obtained.

SYNTHESIS EXAMPLE 13

Synthesis of the Compound [28] {bis(N-p-tolyl-N-4-(4-methylphenylvinyl)phenylamino)-t-butylbenzo[a]perylene}

The target compound [28] was prepared in the same process as Synthesis Example 12 except that N-4-(4-methylphenylvinyl)phenyl-p-toluidine was used in place of di-p-tolylamine.

SYNTHESIS EXAMPLE 14

Synthesis of the Compound [29] {bis(N-p-tolyl-N-4-(2,2-di-p-tolylvinyl)phenylamino)-t-butylbenzo[a]perylene The target compound [29] was prepared in the same process as Synthesis Example 12 except that N-4-(2,2-di-p-tolylvinyl)phenyl-p-toluidine was used in place of di-p-tolylamine.

SYNTHESIS EXAMPLE 15

Synthesis of the Compound [31] {1-adamantylbenzo[a]perylene}

The target compound [31] was prepared in the same process as Synthesis Example 11 except that 1-adamanyl-7,14-dioxo-7,14-dihydrobenzo-[a]perylene was used in place of the t-butyl-7,14-dioxo-7,14-dihydrobenzo[a]-perylene.

SYNTHESIS EXAMPLE 16

Synthesis of the Compound [32] {bis(di-p-tolylamino-(1-adamantyl)benzo[a]perylene)

The target compound [32] was prepared in accordance with the procedures of Synthesis Example 12 except that the compound [31] was used in place of the compound [26].

SYNTHESIS EXAMPLE 17

Synthesis of the Compound [33] {bis(N-p-tolyl-N-4-(4-methylphenylvinyl)phenylamino)-(1-adamantyl)benzo[a]perylene)

The target compound [33] was prepared in the same process as Synthesis Example 16 except that N-4-(4- methylphenylvinyl)phenyl-p-toluidine was used in place of the di-p-tolylamine.

SYNTHESIS EXAMPLE 18

Synthesis of the Compound [34] {bis(N-p-tolyl-N-4-(2,2-di-p-tolylvinyl)phenylamino)-(1-adamantyl)benzo[a]perylene)

The target compound [34] was prepared in the same process as Synthesis Example 16 except that N-4-(2,3-di-p-tolylvinyl)phenyl-p-toluidine was used in place of the di-p-tolylamine.

SYNTHESIS EXAMPLE 19

Synthesis of the Compound [42], {N-p-tolyl-N-4-(4-methylphenylvinyl)phenylamino-t-butylbenzo[a]perylene After the compound [26] was dissolved in dimethylformamide, one equivalence of N-bromosuccinimide was added and stirred at room temperature. After the reaction, reaction mixture was washed with water, and the product was purified with a conventional method to prepare bromo-t-butylbenzo[a]perylene. The compound was introduced in a reaction vessel together with N-4-(4-methylphenylvinyl)phenyl-p-tolylamine, potassium carbonate, copper powder and nitrobenzene, and was stirred at the temperature of 200° C. and 40 hours. After the reaction, the nitrobenzene was removed under vacuum pressure, and chloroform was added and filtrated for removal of inorganic compounds. The filtrate was concentrated and purified with a conventional method. As a result, the target compound [42] was obtained.

SYNTHESIS EXAMPLE 20

Synthesis of the Compound [36] {phenoxybenzo[a]perylene}

The target compound [36] was prepared the same process as Synthesis Example 11 except that phenoxy-7,14-dioxo-7,14-dihydrobenzo[a]-perylene was used in place of the t-butyl-7,14-dioxo-7,14-dihydrobenzo[a]-perylene.

SYNTHESIS EXAMPLE 21

Synthesis of the Compound [40] {N-p-tolyl-N-4-(4-methylphenylvinyl)phenylamino-phenyloxybenzo[a]perylene}

The target compound [40] was prepared the same process as Synthesis Example 19 except that the compound [36] was used in place of the compound [26].

SYNTHESIS EXAMPLE 22

Synthesis of the Compound [48] {di-t-butoxybenzo[a]perylene}

The target compound [48] was prepared the same process as Synthesis Example 11 except that di-t-butyl-7,14-dioxo-7,14-dihydrobenzo[a]-perylene was used in place of the t-butyl-7,14-dioxo-7,14-dihydrobenzo[a]-perylene.

SYNTHESIS EXAMPLE 23

Synthesis of the Compound [51] {bis(N-p-tolyl-N-4-(2,2-di-p-tolylvinyl)phenylamino)-di-t-butoxybenzo[a]perylene}

The target compound [51] was prepared the same process as Synthesis Example 14 except that the compound [48] was used in place of the compound [26].

Examples in that the compounds of the present invention used in the light-emitting layer (Examples 1 to 22, 27 to 30, 35 to 37, 42 to 67, 72 to 75 and 80 to 82), in the light-emitting layer with the hole transporting material (Examples 23 to 26 and 68 to 71), in the light-emitting layer with the electron transporting (Examples 31 to 34, 38, 76 to 79 and 83), in the hole transporting layer (Examples 39, 40, 84 and 85), in the electron transporting layer (Examples 41, 86 and 87) will be described below. Comparative Examples will also be described below.

EXAMPLE 1

An organic EL device in accordance with Example 1 of the present invention had a structure shown in FIG. 1. The organic EL device had a structure of anode 12/light-emitting layer 14/cathode 16 overlying a glass substrate 11, and was fabricated in the following manner.

An ITO film was formed on the glass substrate 11 by sputtering so that the ITO film had a sheet resistance of 20 ohm/□. The thus formed ITO film acts as anode 12. Thereafter, the compound [3] was vacuum deposited on the anode to form the light emitting layer 14 having a thickness of 40 nm. Next, magnesium-silver alloy was vacuum deposited to form the cathode 16 having a film thickness of 200 nm. Thus there was completed, the organic EL device in accordance with Example 1.

When a dc voltage of 5 V was applied to this organic EL device, light emission of 430 cd/m$^2$ was obtained.

EXAMPLE 2

An organic EL device of Example 2 of the present invention was fabricated similarly to Example 1 except that the compound [4] was used as the light-emitting material.

When a dc voltage of 5 V was applied to this organic EL device, light emission of 510 cd/m$^2$ was obtained.

EXAMPLE 3

An organic EL device of Example 3 was fabricated similarly to Example 1 except that the compound [5] was used as the light-emitting material.

When a dc voltage of 5 V was applied to this organic EL device, light emission of 560 cd/m$^2$ was obtained.

EXAMPLE 4

An organic EL device of Example 3 was fabricated similarly to Example 1 except that the compound [6] was used as the light-emitting material.

When a dc voltage of 5 V was applied to this organic EL device, light emission of 400 cd/m$^2$ was obtained.

EXAMPLE 5

An organic EL device of Example 3 was fabricated similarly to Example 1 except that the compound [7] was used as the light-emitting material.

When a dc voltage of 5 V was applied to this organic EL device, light emission of 460 cd/m$^2$ was obtained.

EXAMPLE 6

An organic EL device of Example 6 was fabricated similarly to Example 1 except that the compound [8] was used as the light-emitting material.

When a dc voltage of 5 V was applied to this organic EL device, light emission of 520 cd/m² was obtained.

EXAMPLE 7

An organic EL device of Example 7 was fabricated similarly to Example 1 except that the compound [18] was used as the light-emitting material.

When a dc voltage of 5 V was applied to this organic EL device, light emission of 430 cd/m² was obtained.

EXAMPLE 8

An organic EL device of Example 8 was fabricated similarly to Example 1 except that the compound [19] was used as the light-emitting material.

When a dc voltage of 5 V was applied to this organic EL device, light emission of 510 cd/m² was obtained.

EXAMPLE 9

An organic EL device of Example 9 was fabricated similarly to Example 1 except that the compound [20] was used as the light-emitting material.

When a dc voltage of 5 V was applied to this organic EL device, light emission of 580 cd/m² was obtained.

EXAMPLE 10

An organic EL device of Example 10 having the structure shown in FIG. 1 was fabricated in the following manner.

An ITO film was formed on the glass substrate 11 by ;sputtering so that the ITO film had a sheet resistance of 20 ohm/□. The thus formed ITO film acted as anode 12Thereafter, the compound [5] was formed thereon as the light-emitting layer 14 having a film thickness of 40 nm by a spin-coating method using a chloroform solution. Next, magnesium-silver alloy was vacuum deposited to form the cathode 16 having a film thickness of 200 nm. Thus there was completed the organic EL in accordance with Example 10.

When a dc voltage of 5 V was applied to this organic EL device, light emission of 160 cd/m² was obtained.

EXAMPLE 11

An organic EL device of Example 11 had a structure shown in FIG. 2. The organic EL device had a structure of anode 12/hole transporting layer 13/light-emitting layer 14/electron transport layer 15/cathode 16 overlying the glass substrate 11, and was fabricated in the following manner.

An ITO film was formed on the glass substrate 11 by sputtering so that the ITO film had a sheet resistance of 20 ohm/□. The thus formed ITO film acted as anode 12. Thereafter, N,N'-diphenyl-N,N'-bis(3-methylphenyl)-1,1'-biphenyl-4,4'-diamine [53] was vacuum deposited to form the hole transporting layer 13 having a film thickness of 50 nm. The compound [3] was vacuum deposited thereon to form as the as the light-emitting layer 14 having a film thickness of 40 nm. Then, 2-(4-biphenylyl)-5-(4-t-butylphenyl)-1,3,4-oxadiazole [58] was vacuum deposited thereon as the electron transporting layer 15 having a film thickness of 20 nm. Next, magnesium-silver alloy was vacuum deposited to form the cathode 16 having a film thickness of 200 nm. Thus there was completed the organic EL in accordance with

EXAMPLE 11

When a dc voltage of 10 V was applied to this organic EL device, light emission of 2300 cd/m² was obtained.

EXAMPLE 12

An organic EL device of Example 12 was fabricated similarly to Example 11 except that the compound [4] was used as the light-emitting material.

When a dc voltage of 10 V was applied to this organic EL device, light emission of 3010 cd/m² was obtained.

EXAMPLE 13

An organic EL device of Example 13 was fabricated similarly to Example 11 except that the compound [5] was used as the light-emitting material.

When a dc voltage of 10 V was applied to this organic EL device, light emission of 4100 cd/m² was obtained.

EXAMPLE 14

An organic EL device of Example 14 was fabricated similarly to Example 11 except that the compound [6] was used as the light-emitting material.

When a dc voltage of 10 V was applied to this organic EL device, light emission of 2130 cd/m² was obtained.

EXAMPLE 15

An organic EL device of Example 15 was fabricated similarly to Example 11 except that the compound [7] was used as the light-emitting material.

When a dc voltage of 10 V was applied to this organic EL device, light emission of 3100cc/m² was obtained.

EXAMPLE 16

An organic EL device of Example 16 was fabricated similarly to Example 11 except that the compound [8] was used as the light-emitting material.

When a dc voltage of 10 V was applied to this organic EL device, light emission of 4320 cd/m² was obtained.

EXAMPLE 17

An organic EL device of Example 17 was fabricated similarly to Example 11 except that the compound [24] was used as the light-emitting material.

When a dc voltage of 10 V was applied to this organic EL device, light emission of 2450 cd/m² was obtained.

EXAMPLE 18

An organic EL device of Example 18 was fabricated similarly to Example 11 except that the compound [19] was used as the light-emitting material.

When a dc voltage of 10 V was applied to this organic EL device, light emission of 2970 cd/m² was obtained.

EXAMPLE 19

An organic EL device of Example 19 was fabricated similarly to Example 11 except that the compound [20] was used as the light-emitting material.

When a dc voltage of 10 V was applied to this organic EL device, light emission of 4330 cd/m² was obtained.

EXAMPLE 20

An organic EL device of Example 20 was fabricated similarly to Example 11 except that N,N'-diphenyl-N,N'-bis(3-methylphenyl)-1,1'-biphenyl-4,4'-diamine [54] was used in the hole transporting layer 13 and bis{2-(4-t-butylphenyl)-1,3,4-oxadiazole}-m-phenylene [59] was used in the electron transporting layer 15.

When a dc voltage of 10 V was applied to this organic EL device, light emission of 5120 cd/m² was obtained.

EXAMPLE 21

An organic EL device of Example 21 was fabricated similarly to Example 11 except that the star burst type molecule [55] was used in the hole transporting layer 13, the compound [5] was used in the light-emitting layer 14 and the quinolinol based metal complex [62] was used in the electron transport layer 15.

When a dc voltage of 10 V was applied to this organic EL device, light emission of 4580 cd/m² was obtained.

EXAMPLE 22

An organic EL device of Example 22 was fabricated similarly to Example 11 except that the star burst type molecule [56] was used in the hole transporting layer 13, the compound [5] was used in the light-emitting layer 14 and the quinolinol based metal complex [63] was used in the electron transporting layer 15.

When a dc voltage of 10 V was applied to this organic EL device, light emission of 5130 cd/m² was obtained.

EXAMPLE 23

An organic EL device of Example 23 was fabricated similarly to Example 11 except that a thin film having a thickness of 50 nm formed by co-evaporation of N,N'-diphenyl-N,N'-bis(3-methylphenyl)-1,1'-biphenyl-4,4'-diamine [54] and the compound [5] in a weight ratio of 1:10 was used as the light-emitting layer 14.

When a dc voltage of 10 V was applied to this organic EL device, light emission of 4250 cd/m² was obtained.

EXAMPLE 24

An organic EL device of Example 24 was fabricated similarly to Example 23 except that the compound [4] was used in place of the compound [5].

When a dc voltage of 10 V was applied to this organic EL device, light emission of 3280 cd/m² was obtained.

EXAMPLE 25

An organic EL device of Example 25 was fabricated similarly to Example 23 except that the compound [18] was used in place of the compound [5].

When a dc voltage of 10 V was applied to this organic EL device, light emission of 4370 cd/m² was obtained.

EXAMPLE 26

An organic EL device of Example 26 was fabricated similarly to Example 23 except that the compound [20] was used in place of the compound [5].

When a dc voltage of 10 V was applied to this organic EL device, light emission of 5400 cd/m² was obtained,

EXAMPLE 27

An organic EL device of Example 27 had a structure shown in FIG. 3 The organic EL device had a structure of anode 12/hole transporting layer 13/light-emitting layer 14/cathode 16 overlying the glass substrate 11, and was fabricated in the following manner.

An ITO film was formed on the glass substrate 11 by sputtering so that the ITO film had a sheet resistance of 20 ohm/□. The thus formed ITO film acted as anode 12. Thereafter, N,N'-diphenyl-N,N'-bis(1-naphthyl)-1,1'-biphenyl-4,4'-diamine [54] was vacuum deposited to form the hole transporting layer 13 having a film thickness of 50 nm. The compound [3] was vacuum deposited thereon to form the light-emitting layer 14 having a film thickness of 40 nm. Next, magnesium-silver alloy was vacuum deposited to form the cathode 16 having a film thickness of 200 nm. Thus there was completed the organic EL in accordance with Example 27.

When a dc voltage of 10 V was applied to this organic EL device, light emission of 1670 cd/m² was obtained.

EXAMPLE 28

An organic EL device of Example 28 was fabricated similarly to Example 27 except that the compound [5] was used in place of the compound [3].

When a dc voltage of 10 V was applied to this organic EL device, light emission of 2960 cd/m² was obtained.

EXAMPLE 29

An organic EL device of Example 29 was fabricated similarly to Example 27 except that the compound [7] was used in place of the compound [3].

When a dc voltage of 10 V was applied to this organic EL device, light emission of 1980 cd/m² was obtained.

EXAMPLE 30

An organic EL device of Example 30 was fabricated similarly to Example 27 except that the compound [20] was used in place of the compound [3].

When a dc voltage of 10 V was applied to this organic EL device, light emission of 3150 cd/m² was obtained.

EXAMPLE 31

An organic EL device of Example 31 was fabricated similarly to Example 27 except that a thin film having a thickness of 50 nm formed by co-evaporation of the quinolinol based metal complex [62] and the compound [3] in a weight ratio of 20:1 was used as the light-emitting layer 14.

When a dc voltage of 10 V was applied to this organic EL device, light emission of 2360 cd/m² was obtained.

EXAMPLE 32

An organic EL device of Example 32 was fabricated similarly to Example 31 except that the compound [5] was used in place of the compound [3].

When a dc voltage of 10 V was applied to this organic EL device, light emission of 3060 cd/m² was obtained.

EXAMPLE 33

An organic EL device of Example 33 was fabricated similarly to Example 31 except that the compound [19] was used in place of the compound [3].

When a dc voltage of 10 V was applied to this organic EL device, light emission of 2610 cd/m$^2$ was obtained.

EXAMPLE 34

An organic EL device of Example 34 was fabricated similarly to Example 31 except that the compound [8] was used in place of the compound [3].

When a dc voltage of 10 V was applied to this organic EL device, light emission of 3110 cd/m$^2$ was obtained.

EXAMPLE 35

An organic EL device of Example 35 had a structure shown in FIG. 4. The organic EL device had a structure of anode 12/light-emitting layer 14/electron transporting layer 15/cathode 16 overlying the glass substrate 11, and was fabricated in the following manner.

An ITO film was formed on the glass substrate 11 by sputtering so that the ITO film had a sheet resistance of 20 ohm/□. The thus formed ITO film acted as anode 12. Thereafter, the compound [5] was vacuum deposited to form the light-emitting layer 14 having a film thickness of 50 nm. The triazole derivative [60] was vacuum deposited thereon to form the electron transmitting layer having a film thickness of 50 nm. Next, magnesium-silver alloy was vacuum deposited to form the cathode 16 having a film thickness of 200 nm. Thus there was completed the organic EL in accordance with Example 35.

When a dc voltage of 10 V was applied to this organic EL device, light emission of 1790 cd/m$^2$ was obtained.

EXAMPLE 36

An organic EL device of Example 36 was fabricated similarly to Example 35 except that the compound [8] was used in place of the compound [5].

When a dc voltage of 10 V was applied to this organic EL device, light emission of 1910 cd/m$^2$ was obtained.

EXAMPLE 37

An organic EL device of Example 37 was fabricated similarly to Example 35 except that the compound [19] was used in place of the compound [5].

When a dc voltage of 10 V was applied to this organic EL device, light emission of 1610 cd/m$^2$ was obtained

EXAMPLE 38

An organic EL device of Example 38 was fabricated similarly to Example 27 except that the N,N'-diphenyl-N, N'-bis(3-methylphenyl)-1,1'-biphenyl-4,4'-diamine [53] o1 was used in the hole transporting layer 13, and a thin film formed by co-evaporation of the quinolinol based metal complex [64] and the compound [19] in a weight ratio of 20:1 was used in the light-emitting layer 14.

When a dc voltage of 10 V was applied to this organic EL device, light emission of 2430 cd/m$^2$ was obtained

EXAMPLE 39

An organic EL device of Example 39 was fabricated similarly to Example 11 except that the compound [3] was used in the hole transporting layer 13, and the quinolinol based metal complex [64] was used in the light-emitting layer 14.

When a dc voltage of 10 V was applied to this organic EL device, light emission of 1630 cd/m$^2$ was obtained.

EXAMPLE 40

An organic EL device of Example 40 was fabricated similarly to Example 39 except that the compound [20] was used in the hole transporting layer 13.

When a dc voltage of 10 V was applied to this organic EL device, light emission of 1970 cd/m$^2$ was obtained.

EXAMPLE 41

An organic EL device of Example 41 was fabricated similarly to Example 11 except that the compound [6] was used in the electron transport layer 15, and the quinolinol based metal complex [62] was used in the light-emitting layer 14.

When a dc voltage of 10 V was applied to this organic EL device, light emission of 810 cd/m$^2$ was obtained.

COMPARATIVE EXAMPLE 1

An organic EL device of Comparative Example 1 was fabricated similarly to Example 11 except that 3,9-bis(di-p-tolylamino)perylene was used in the light-emitting layer 14.

When a dc voltage of 10 V was applied to this organic EL device, light emission of 1600 cd/m$^2$ was obtained.

COMPARATIVE EXAMPLE 2

An organic EL device of Comparative Example 2 was fabricated similarly to Example 11 except that 3,9-bis(N-4-(4-methylphenylvinyl)phenyl-N-p-tolylamino)perylene was used in the light-emitting layer 14.

When a dc voltage of 10 V was applied to this organic EL device, light emission of 2000 cd/m$^2$ was obtained.

EXAMPLE 42

An organic EL device of Example 42 was fabricated similarly to Example 1 except that the compound [26] was used in place of the compound [3].

When a dc voltage of 5 V was applied to this organic EL device, light emission of 150 cd/m$^2$ was obtained,

EXAMPLE 43

An organic EL device of Example 43 was fabricated similarly to Example 42 except that the compound [27] was used as the light-emitting material.

When a dc voltage of 5 V was applied to this organic EL device, light emission of 150 cd/m$^2$ was obtained.

EXAMPLE 44

An organic EL device of Example 44 was fabricated similarly to Example 42 except that the compound [28] was used as the light-emitting material.

When a dc voltage of 5 V was applied to this organic EL device, light emission of 250 cd/m² was obtained.

EXAMPLE 45

An organic EL device of Example 45 was fabricated similarly to Example 42 except that the compound [29] was used as the light-emitting material.

When a dc voltage of 5 V was applied to this organic EL device, light emission of 290 cd/m² was obtained.

EXAMPLE 46

An organic EL device of Example 46 was fabricated similarly to Example 42 except that the compound [31] was used as the light-emitting material.

When a dc voltage of 5 V was applied to this organic EL device, light emission of 170 cd/m² was obtained.

EXAMPLE 47

An organic EL device of Example 47 was fabricated similarly to Example 42 except that the compound [32] was used as the light-emitting material.

When a dc voltage of 5 V was applied to this organic EL device, light emission of 200 cd/m² was obtained.

EXAMPLE 48

An organic EL device of Example 48 was fabricated similarly to Example 42 except that the compound [33] was used as the light-emitting material.

When a dc voltage of 5 V was applied to this organic EL device, light emission of 240 cd/m² was obtained.

EXAMPLE 49

An organic EL device of Example 49 was fabricated similarly to Example 42 except that the compound [34] was used as the light-emitting material.

When a dc voltage of 5 V was applied to this organic EL device, light emission of 280 cd/m² was obtained.

EXAMPLE 50

An organic EL device of Example 50 was fabricated similarly to Example 42 except that the compound [36] was used as the light-emitting material.

When a dc voltage of 5 V was applied to this organic EL device, light emission of 160 cd/m² was obtained.

EXAMPLE 51

An organic EL device of Example 51 was fabricated similarly to Example 42 except that the compound [40] was used as the light-emitting material.

When a dc voltage of 5 V was applied to this organic EL device, light emission of 200 cd/m² was obtained.

EXAMPLE 52

An organic EL device of Example 52 was fabricated similarly to Example 42 except that the compound [42] was used as the light-emitting material.

When a dc voltage of 5 V was applied to this organic EL device, light emission of 190 cd/m² was obtained.

EXAMPLE 53

An organic EL device of Example 53 was fabricated similarly to Example 10 except that the compound [29] was used in place of the compound [5].

When a dc voltage of 5 V was applied to this organic EL device, light emission of 80 cd/m² was obtained

EXAMPLE 54

An organic EL device of Example 54 was fabricated similarly to Example 11 except that the compound [26] was used in place of the compound [5].

When a dc voltage of 10 V was applied to this organic EL device, light emission of 900 cd/m² was obtained.

EXAMPLE 55

An organic EL device of Example 65 was fabricated similarly to Example 54 except that the compound [27] was used as the light-emitting material.

When a dc voltage of 10 V was applied to this organic EL device, light emission of 2600 cd/m² was obtained.

EXAMPLE 56

An organic EL device of Example 56 was fabricated similarly to Example 54 except that the compound [28] was used as the lightemitting material.

When a dc voltage of 10 V was applied to this organic EL device, light emission of 3100 cd/m² was obtained.

EXAMPLE 57

An organic EL device of Example 57 was fabricated similarly to Example 54 except that the compound [29] was used as the light-emitting material.

When a dc voltage of 10 V was applied to this organic EL device, light emission of 3700 cd/m² was obtained.

EXAMPLE 58

An organic EL device of Example 58 was fabricated similarly to Example 54 except that the compound [31] was used as the light-emitting material.

The EL device thus fabricated exhibited a luminescence of 930 cd/m² at an applied DC voltage of 10 volts.

EXAMPLE 59

An organic EL device of Example 59 was fabricated similarly to Example 54 except that the compound [32] was used as the light-emitting material.

When a dc voltage of 10 V was applied to this organic EL device, light emission of 2300 cd/m² was obtained.

EXAMPLE 60

An organic EL device of Example 60 was fabricated similarly to Example 54 except that the compound [33] was used as the light-emitting material.

When a dc voltage of 10 V was applied to this organic EL device, light emission of 2980 cd/m² was obtained.

EXAMPLE 61

An organic EL device of Example 61 was fabricated similarly to Example 54 except that the compound [34] was used as the light-emitting material.

EXAMPLE 62

An organic EL device of Example 62 was fabricated similarly to Example 54 except that the compound [48] was used as the light-emitting material.

When a dc voltage of 10 V was applied to this organic EL device, light emission of 670 cd/m$^2$ was obtained.

EXAMPLE 63

An organic EL device of Example 63 was fabricated similarly to Example 54 except that the compound [51] was used as the light-emitting material.

When a dc voltage of 10 V was applied to this organic EL device, light emission of 1830 cd/m$^2$ was obtained.

EXAMPLE 64

An organic EL device of Example 64 was fabricated similarly to Example 54 except that the compound [42] was used as the light-emitting material.

When a dc voltage of 10 V was applied to this organic EL device, light emission of 1910 cd/m$^2$ was obtained.

EXAMPLE 65

An organic EL device of Example 65 was fabricated similarly to Example 54 except that the N,N'-diphenyl-N,N'-bis(1-naphthyl)-1,1'-biphenyl-4,4'-diamine [54] was used as the hole transporting material and the bis{2-(4-t-butylphenyl)-1,3,4-oxadiazole}-m-phenylene [59] was used as the electron transporting material.

When a dc voltage of 10 V was applied to this organic EL device, light emission of 850 cd/m$^2$ was obtained.

EXAMPLE 66

An organic EL device of Example 66 was fabricated similarly to Example 54 except that the star-burst type molecule [55] was used as the hole transporting material, the compound [29] was used as the light-emitting material and the quinolinol based metal complex [62] was used as the electron transporting material.

When a dc voltage of 10 V was applied to this organic EL device, light emission of 4320 cd/m$^2$ was obtained.

EXAMPLE 67

All organic EL device of Example 67 was fabricated similarly to Example 54 except that the star-burst type molecule [56] was used as the hole transporting material, the compound [42] was used as the light-emitting material and the quinolinol based metal complex [63] was used as the electron transporting material.

When a dc voltage of 10 V was applied to this organic EL device, light emission of 2060 cd/m$^2$ was obtained.

EXAMPLE 68

An organic EL device of Example 68 was fabricated similarly to Example 54 except that a thin film having a thickness of 50 nm formed by co-evaporation of N,N-diphenyl-N,N'-bis(3-methylphenyl)-1,1'-biphenyl-4,4'-diamine [54] and the compound [28] in a weight ratio of 1:10 was used as the light-emitting layer 14.

When a dc voltage of 10 V was applied to this organic EL device, light emission of 3470 cd/m$^2$ was obtained.

EXAMPLE 69

An organic EL device of Example 69 was fabricated similarly to Example 68 except that the compound [32] was used in place of the compound [28].

When a dc voltage of 10 V was applied to this organic EL device, light emission of 2510 cd/m$^2$ was obtained.

EXAMPLE 70

An organic EL device of Example 70 was fabricated similarly to Example 68 except that the compound [34] was used in place of the compound [28].

When a dc voltage of 10 V was applied to this organic EL device, light emission of 3720 cd/m$^2$ was obtained.

EXAMPLE 71

An organic EL device of Example 71 was fabricated similarly to Example 68 except that the compound [40] was used in place of the compound [28].

When a dc voltage of 10 V was applied to this organic EL device, light emission of 2010 cd/m$^2$ was obtained.

EXAMPLE 72

An organic EL device of Example 72 was fabricated similarly to Example 27 except that the compound [27] was used in place of the compound [3].

When a dc voltage of 10 V was applied to this organic EL device, light emission of 1770 cd/m$^2$ was obtained.

EXAMPLE 73

An organic EL device of Example 73 was fabricated similarly to Example 72 except that the compound [26] was used in place of the compound [27].

When a dc voltage of 10 V was applied to this organic EL device, light emission of 820 cd/m$^2$ was obtained.

EXAMPLE 74

An organic EL device of Example 74 was fabricated similarly to Example 72 except that the compound [33] was used in place of the compound [27].

When a dc voltage of 10 V was applied to this organic EL device, light emission of 2270 cd/m$^2$ was obtained.

EXAMPLE 75

An organic EL device of Example 75 was fabricated similarly to Example 72 except that the compound [40] was used in place of the compound [27].

When a dc voltage of 10 V was applied to this organic EL device, light emission of 1540 cd/m$^2$ was obtained.

EXAMPLE 76

An organic EL device of Example 76 was fabricated similarly to Example 72 except that a thin film having a thickness of 50 nm formed by co-evaporation of the quinolinol based metal complex [62] and the compound [28] in a weight ratio of 20:1 was used as the light-emitting layer 14.

When a dc voltage of 10 V was applied to this organic EL device, light emission of 2360 cd/m$^2$ was obtained.

EXAMPLE 77

An organic EL device of Example 77 was fabricated similarly to Example 76 except that the compound [31] was used in place of the compound [28].

When a dc voltage of 10 V was applied to this organic EL device, light emission of 790 cd/m$^2$ was obtained.

EXAMPLE 78

An organic EL device of Example 78 was fabricated similarly to Example 76 except that the compound [34] was used in place of the compound [28].

When a dc voltage of 10 V was applied to this organic EL device, light emission of 3020 cd/m$^2$ was obtained.

EXAMPLE 79

An organic EL device of Example 79 was fabricated similarly to Example 76 except that the compound [51] was used in place of the compound [28].

When a dc voltage of 10 V was applied to this organic EL device, light emission of 1870 cd/m$^2$ was obtained.

EXAMPLE 80

An organic EL device of Example 80 was fabricated similarly to Example 35 except that the compound [26] was used in place of the compound [5].

When a dc voltage of 10 V was applied to this organic EL device, light emission of 990 cd/m$^2$ was obtained.

EXAMPLE 81

An organic EL device of Example 81 was fabricated similarly to Example 80 except that the compound [32] was used in place of the compound [26].

When a dc voltage of 10 V was applied to this organic EL device, light emission of 2020 cd/m$^2$ was obtained.

EXAMPLE 82

An organic EL device of Example 82 was fabricated similarly to Example 80 except that the compound [28] was used in place of the compound [26].

When a dc voltage of 10 V was applied to this organic EL device, light emission of 2600 cd/m$^2$ was obtained.

EXAMPLE 83

An organic EL device of Example 83 was fabricated similarly to Example 72 except that the N,N'-diphenyl-N, N'-bis(3-methylphenyl)-1,1'-biphenyl-4,4'-diamine [53] was used as the hole transporting layer 13, and a thin film by co-evaporation of the quinolinol based metal complex [64] and the compound [33] in a weight ratio of 20:1 was used as the light-emitting layer 14.

When a dc voltage of 10 V was applied to this organic EL device, light emission of 2250 cd/m$^2$ was obtained.

EXAMPLE 84

An organic EL device of Example 84 was fabricated similarly to Example 54 except that the compound [29] was used in the hole transporting layer 13, the quinolinol based metal complex [64] was used in the light-emitting layer 14.

When a dc voltage of 10 V was applied to this organic EL device, light emission of 1970 cd/m$^2$ was obtained.

EXAMPLE 85

An organic EL device of Example 85 was fabricated similarly to Example 84 except that the compound [32] was used in the hole transporting layer 13.

When a dc voltage of 10 V was applied to this organic EL device, light emission of 1630 cd/m$^2$ was obtained.

EXAMPLE 86

An organic EL device of Example 86 was fabricated similarly to Example 54 except that the compound [26] was used in the electron transport layer 15 and the quinolinol based metal complex [62] was used in the light-emitting layer 14.

When a dc voltage of 10 V was applied to this organic EL device, light emission of 730 cd/m$^2$ was obtained.

EXAMPLE 87

An organic EL device of Example 87 was fabricated similarly to Example 86 except that the compound [29] was used in place of the compound [26].

When a dc voltage of 10 V was applied to this organic EL device, light emission of 690 cd/m$^2$ was obtained.

COMPARATIVE EXAMPLE 3

An organic EL device of Comparative Example 3 was fabricated similarly to Example 54 except that bis(di-p-tolylamino)benzoperylene was used in the light-emitting layer 14.

When a dc voltage of 10 V was applied to this organic EL device, light emission of 1800 cd/m$^2$ was obtained.

COMPARATIVE EXAMPLE 4

An organic EL device of Comparative Example 4 was fabricated similarly to Example 54 except that (4-(4-methylphenylvinyl)phenyl-p-tolylamino)benzo[a]-perylene was used in the light-emitting layer 14.

When a dc voltage of 10 V was applied to this organic EL device, light emission of 2000 cd/m$^2$ was obtained.

Since the above embodiments are described only for examples, the present invention is not limited to the above embodiments and various modifications or alterations can be easily made therefrom by those skilled in the art without departing from the scope of the present invention.

What is claimed is:

1. An organic EL device comprising an anode, a cathode, and one or more organic thin-film layer including a light-emitting layer sandwiched between the anode and the cathode, at least one of the organic thin-film layers including a benzoperylene compound represented by a general formula [2] as follows:

[2]

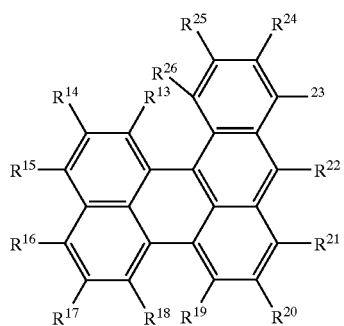

wherein each of $R^{13}$ to $R^{26}$ independently represents hydrogen atom, halogen atom, hydroxyl group, substituted or non-substituted amino group, nitro group, cyano group, substituted or non-substituted alkyl group having not less than four carbon atoms, substituted or non-substituted alkenyl group, substituted or non-substituted styryl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group or substituted or non-substituted aryloxy group; and two of $R^{13}$ to $R^{26}$ may form a ring; and at least one of $R^{13}$ to $R^{26}$ is a group with steric hindrance for suppressing aggregation of molecules, wherein the group with steric hindrance included in the general formula [2] is adamantyl.

* * * * *